(12) United States Patent
Yun et al.

(10) Patent No.: US 11,714,214 B2
(45) Date of Patent: Aug. 1, 2023

(54) IMAGE SENSOR INCLUDING COLOR SEPARATING LENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Seokho Yun, Seoul (KR); Sookyoung Roh, Yongin-si (KR); Sangyun Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 69 days.

(21) Appl. No.: 17/514,807

(22) Filed: Oct. 29, 2021

(65) Prior Publication Data
US 2022/0137268 A1    May 5, 2022

(30) Foreign Application Priority Data

Oct. 30, 2020   (KR) .................. 10-2020-0143876
Jun. 25, 2021   (KR) .................. 10-2021-0083123

(51) Int. Cl.
*G02B 3/00*   (2006.01)
*G02B 27/10*   (2006.01)
(Continued)

(52) U.S. Cl.
CPC ....... *G02B 3/0006* (2013.01); *G02B 27/1013* (2013.01); *H04N 23/60* (2023.01); *H04N 25/11* (2023.01)

(58) Field of Classification Search
CPC .. G02B 3/0006; G02B 27/1013; G02B 5/201; H04N 23/60; H04N 25/11; H04N 23/54;
(Continued)

(56) References Cited

U.S. PATENT DOCUMENTS 6,999,119 B1   2/2006   Shibazaki et al.
7,745,779 B2   6/2010   Conners
(Continued)

FOREIGN PATENT DOCUMENTS

JP            4196029 B2     12/2008
KR   10-2016-0024607 A       3/2016
WO        2020/007622 A1     1/2020

OTHER PUBLICATIONS

Communication dated Mar. 17, 2022 issued by the European Patent Office in European Patent Application No. 21205219.5.
(Continued)

*Primary Examiner* — Lin Ye
*Assistant Examiner* — Tuan H Le
(74) *Attorney, Agent, or Firm* — Sughrue Mion, PLLC

(57) ABSTRACT

Provided is an image sensor including a color separating lens array. The image sensor includes a sensor substrate including a first pixel configured to sense first wavelength light, and a second pixel configured to sense second wavelength light; and a color separating lens array including a first wavelength light condensing region in which the first wavelength light is condensed onto the first pixel, wherein an area of the first wavelength light condensing region is greater than an area of the first pixel, and a distance between the sensor substrate and the color separating lens array is less than a focal distance of the first wavelength light condensing region with respect to the first wavelength light.

36 Claims, 36 Drawing Sheets

(51) Int. Cl.
  *H04N 23/60* (2023.01)
  *H04N 25/11* (2023.01)
(58) Field of Classification Search
  CPC ...... H04N 23/55; H04N 23/84; H04N 25/704;
         H01L 27/14621; H01L 27/14625; H01L
         27/14627; H01L 27/14607; H01L
         27/14645; H01L 27/14812; H01L
         27/14868; H01L 27/1465; H01L
         27/14652; H01L 27/14605; H01L
         27/14643; H01L 27/14603; H01L 27/1461
  See application file for complete search history.

(56) References Cited

U.S. PATENT DOCUMENTS

| | | | |
|---|---|---|---|
| 8,289,422 B2 | 10/2012 | Hiramoto et al. | |
| 9,628,685 B2 | 4/2017 | Kim et al. | |
| 2008/0173793 A1 | 7/2008 | Mokhnatyuk | |
| 2008/0251873 A1* | 10/2008 | Kasano | H01L 27/14621 257/E31.127 |
| 2010/0165464 A1* | 7/2010 | Lin | G02B 27/1006 359/570 |
| 2010/0230583 A1* | 9/2010 | Nakata | H01L 27/14621 257/E31.127 |
| 2012/0206637 A1 | 8/2012 | Hiramoto et al. | |
| 2012/0248561 A1 | 10/2012 | Hakko | |
| 2014/0139708 A1* | 5/2014 | Ota | H01L 27/14621 348/282 |
| 2018/0131882 A1* | 5/2018 | Nam | G01J 1/0437 |
| 2021/0124179 A1 | 4/2021 | Yun et al. | |
| 2021/0288095 A1 | 9/2021 | Delga et al. | |
| 2022/0293657 A1* | 9/2022 | Chou | H01L 27/14623 |

OTHER PUBLICATIONS

Chen et al., "GaN Metalens for Pixel-Level Full-Color Routing at Visible Light," American Chemical Society, Nano Letters 2017, vol. 17, Sep. 2017, pp. 6345-6352.

Nishiwaki et al., "Efficient colour splitters for high-pixel-density image sensors," Nature Photonics, vol. 7, Mar. 2013, pp. 240-246.

* cited by examiner

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 2C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

[Security]

IMAGE SENSOR INCLUDING COLOR SEPARATING LENS ARRAY AND ELECTRONIC APPARATUS INCLUDING THE IMAGE SENSOR

CROSS-REFERENCE TO RELATED APPLICATIONS

This application is based on and claims priority under 35 U.S.C. § 119 to Korean Patent Application No. 10-2020-0143876, filed on Oct. 30, 2020, and Korean Patent Application No. 10-2021-0083123, filed on Jun. 25, 2021, in the Korean Intellectual Property Office, the disclosures of which are incorporated by reference herein in their entirety.

BACKGROUND

1. Field

The disclosure relates to an image sensor including a color separating lens array capable of focusing incident light separately according to wavelengths of the incident light, and an electronic apparatus including the image sensor.

2. Description of the Related Art

Image sensors generally sense the color of incident light by using a color filter. However, a color filter may have low light utilization efficiency because the color filter absorbs light of colors other than the corresponding color of light of the color filter. For example, when an RGB color filter is used, only ⅓ of the incident light is transmitted and the other, that is, ⅔ of the incident light, is absorbed. Thus, the light utilization efficiency is only about 33%. Thus, in a color display apparatus or a color image sensor, most light loss occurs in the color filter.

SUMMARY

Provided are an image sensor having improved light utilization efficiency by using a color separating lens array capable of focusing incident light separately according to wavelengths of the incident light, and an electronic apparatus including the image sensor.

Additional aspects will be set forth in part in the description which follows and, in part, will be apparent from the description, or may be learned by practice of the presented embodiments of the disclosure.

According to an embodiment, an image sensor includes a sensor substrate including a first pixel configured to sense first wavelength light, and a second pixel configured to sense second wavelength light, and a color separating lens array provided on the sensor substrate and including a first wavelength light condensing region in which the first wavelength light, from incident light, is condensed onto the first pixel, wherein an area of the first wavelength light condensing region is greater than an area of the first pixel, and a distance between the sensor substrate and the color separating lens array is less than a focal distance of the first wavelength light according to the first wavelength light condensing region.

According to another embodiment, an image sensor includes a sensor substrate including a first pixel configured to sense first wavelength light, and a second pixel configured to sense second wavelength light, and a color separating lens array provided on the sensor substrate and including a first wavelength light condensing region in which the first wavelength light, from incident light, is condensed onto the first pixel, the first wavelength light condensing region having an area greater than an area of the first pixel, wherein a pixel pitch of the sensor substrate is about 0.9 μm to about 1.3 μm, and a distance between the sensor substrate and the color separating lens array is about 110% to about 180% of the pixel pitch of the sensor substrate.

According to another embodiment, an image sensor includes a sensor substrate including a first pixel configured to sense first wavelength light, and a second pixel configured to sense second wavelength light, and a color separating lens array provided on the sensor substrate and including a first wavelength light condensing region in which the first wavelength light, from incident light, is condensed onto the first pixel, the first wavelength light condensing region having an area greater than an area of the first pixel, wherein a pixel pitch of the sensor substrate is about 0.5 μm to about 0.9 μm, and a distance between the sensor substrate and the color separating lens array is about 70% to about 120% of the pixel pitch of the sensor substrate.

According to an embodiment, an electronic apparatus includes an image sensor configured to convert an optical image into an electrical signal, and a processor configured to control operations of the image sensor and to store and output a signal generated by the image sensor, wherein the image sensor includes a sensor substrate including a first pixel configured to sense first wavelength light, and a second pixel configured to sense second wavelength light, and a color separating lens array provided on the sensor substrate and including a first wavelength light condensing region in which the first wavelength light, from incident light, is condensed onto the first pixel, an area of the first wavelength light condensing region is greater than an area of the first pixel, and a distance between the sensor substrate and the color separating lens array is less than a focal distance of the first wavelength light according to the first wavelength light condensing region.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A to 2C are diagrams showing examples of various pixel arrangements in a pixel array of an image sensor;

DETAILED DESCRIPTION

Figure 1:
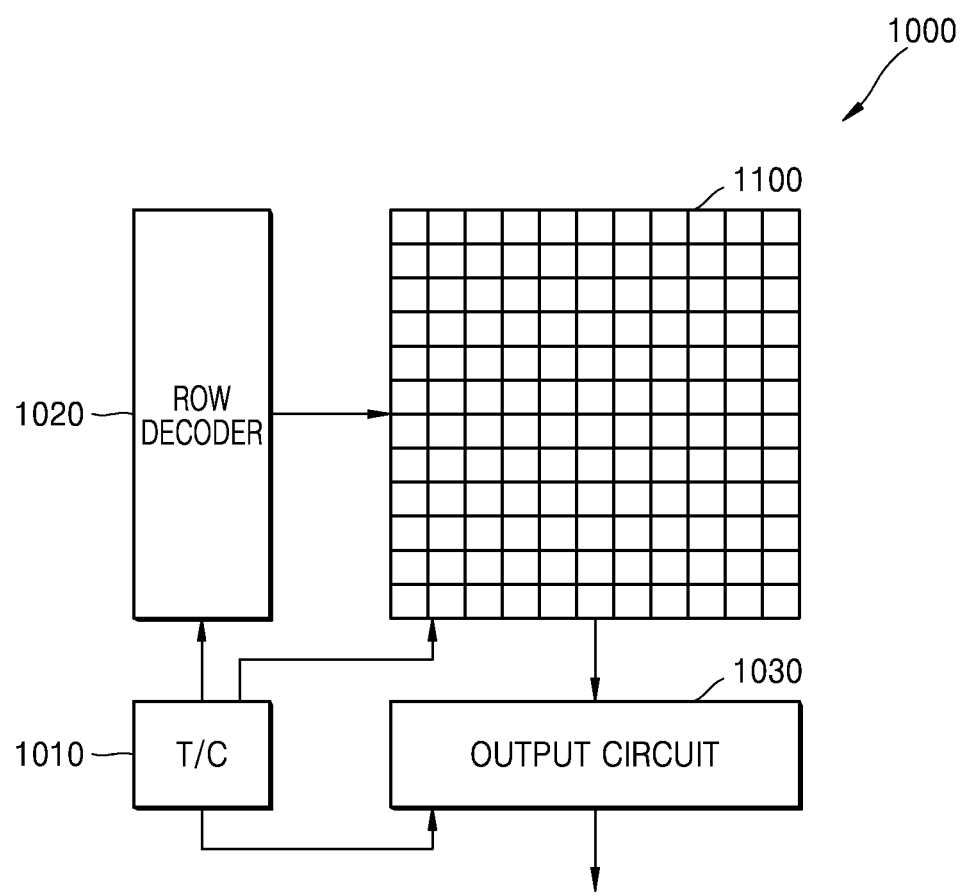
FIG. 1 is a block diagram of an image sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a color separating lens array and an electronic apparatus including the image sensor will be described in detail with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing at least one function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

Unless otherwise stated, each range disclosed herein will be understood to encompass and be a disclosure of each discrete point within the range and all possible subranges within the range.

As used herein, the term "about" will be understood as referring to an approximate range of a numerical value by a person of ordinary skill in the art and will vary in some extent depending on the context in which it is used. For example, "about" may mean plus or minus a certain percentage (e.g., 10% or less) of a particular range or value.

FIG. 1 is a block diagram of an image sensor 1000 according to an embodiment. Referring to FIG. 1, the image sensor 1000 may include a pixel array 1100, a timing controller 1010, a row decoder 1020, and an output circuit 1030. An image sensor 1000 may include a charge-coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include the column decoder and a plurality of ADCs arranged corresponding to respective columns in the pixel array 1100 or one ADC arranged at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths. The pixel arrangement may be implemented in various ways. For example, FIGS. 2A to 2C show various pixel arrangement in the pixel array 1100 of the image sensor 1000.

Figure 2A:
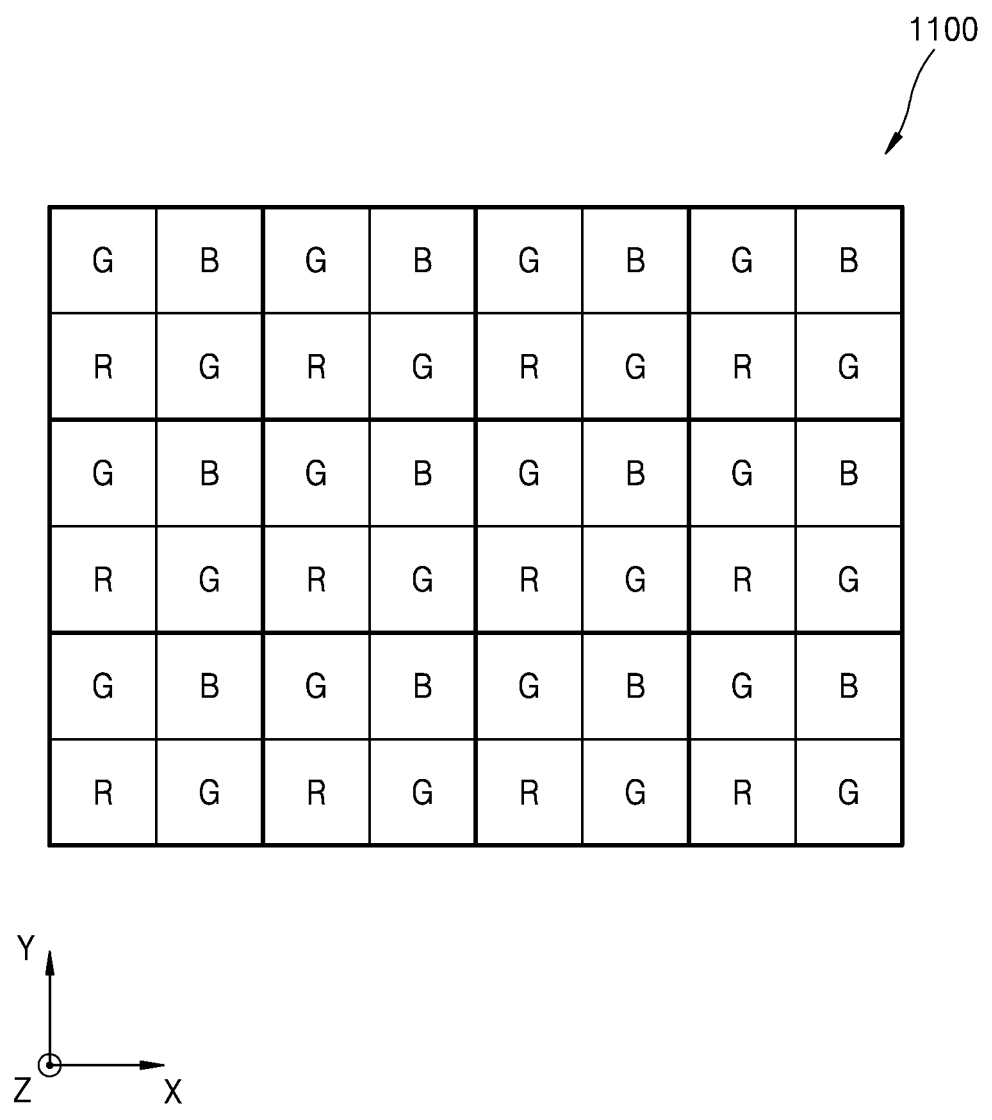

FIG. 2A shows a Bayer pattern that is generally adopted in the image sensor 1000. Referring to FIG. 2A, one unit pattern includes four quadrant regions, and first through fourth quadrants may be a blue pixel B, a green pixel G, a red pixel R, and another green pixel G, respectively. The unit patterns may be repeatedly and two-dimensionally arranged in a first direction (e.g., X direction) and a second direction (e.g., Y direction). In other words, two green pixels G are arranged in one diagonal direction and one blue pixel B and one red pixel R are arranged in another diagonal direction in a unit pattern of a 2×2 array form. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged in a second direction.

The pixel array 1100 may be arranged in various arrangement patterns, rather than the Bayer pattern. For example, referring to FIG. 2B, a CYGM arrangement, in which a magenta pixel M, a cyan pixel C, a yellow pixel Y, and a green pixel G configure one unit pattern, may be used. Also, referring to FIG. 2C, an RGBW arrangement, in which a green pixel G, a red pixel R, a blue pixel B, and a white pixel W configure one unit pattern, may be used. Although not shown in the drawings, the unit pattern may have a 3×2 array form. In addition to the above examples, the pixels in the pixel array 1100 may be arranged in various ways according to color characteristics of the image sensor 1000. Hereinafter, it will be described that the pixel array 1100 of the image sensor 1000 has the Bayer pattern, but the operating principles of the disclosure may be applied to other patterns of pixel arrangement than the Bayer pattern.

Figure 3A:
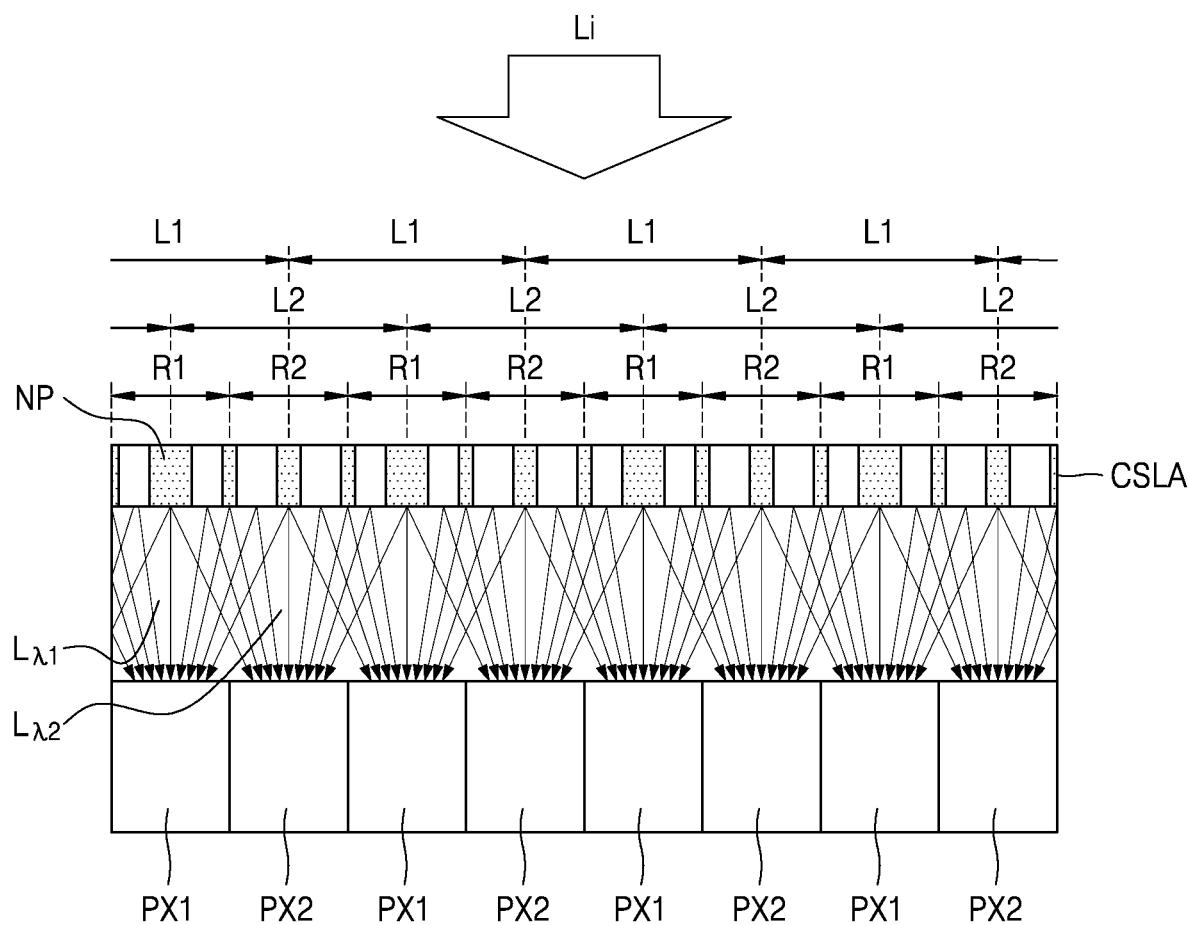
FIGS. 3A and 3B are conceptual diagrams showing a structure and operations of a color separating lens array according to an embodiment.
Figure 3B:
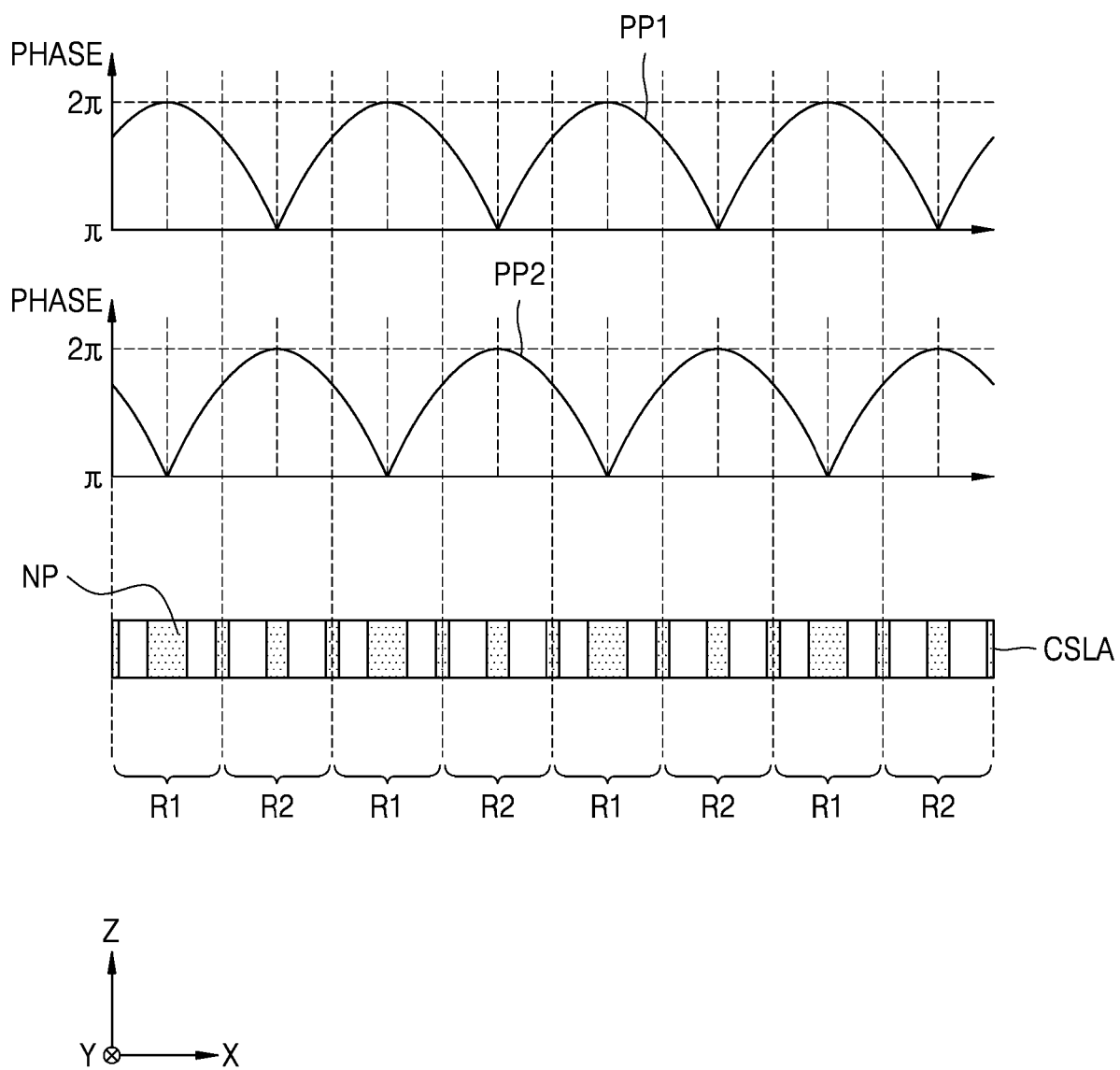

The pixel array 1100 of the image sensor 1000 may include a color separating lens array for condensing light of a color corresponding to each pixel. FIGS. 3A and 3B are diagrams showing a structure and operations of the color separating lens array.

Referring to FIG. 3A, a color separating lens array CSLA may include a plurality of nanoposts NP that change a phase of incident light Li differently according to incident locations thereof. The color separating lens array CSLA may be partitioned in various ways. For example, the color separating lens array CSLA may be partitioned as a region (hereinafter referred to as a first pixel corresponding region) R1, which corresponds to a first pixel PX1 on which first wavelength light $L_{\lambda 1}$ included in the incident light Li is condensed, and a region (hereinafter referred to as a second pixel corresponding region) R2, which corresponds to a second pixel PX2 on which second wavelength light $L_{\lambda 2}$ included in the incident light Li is condensed. Each of the first and second pixel corresponding regions R1 and R2 may include one or more nanoposts NP, and the first and second pixel corresponding regions R1 and R2 may respectively face the first and second pixels PX1 and PX2. In another example, the color separating lens array CSLA may be partitioned as a first wavelength light condensing region L1 in which the first wavelength light $L_{\lambda 1}$ is condensed onto the first pixel PX1 and a second wavelength light condensing region L2 in which the second wavelength light $L_{\lambda 2}$ is condensed onto the second pixel PX2. The first and second wavelength light condensing regions L1 and L2 may partially overlap each other.

The color separating lens array CSLA may generate different phase profiles of the first wavelength light $L_{\lambda 1}$ and the second wavelength light $L_{\lambda 2}$ included in the incident light Li so that the first wavelength light $L_{\lambda 1}$ may be condensed onto the first pixel PX1 and the second wavelength light $L_{\lambda 2}$ may be condensed onto the second pixel PX2.

For example, referring to FIG. 3B, the color separating lens array CSLA may allow the first wavelength light $L_{\lambda 1}$ to have a first phase profile PP1 and the second wavelength light $L_{\lambda 2}$ to have a second phase profile PP2 at a position immediately after passing through the color separating lens array CSLA, e.g., on a lower surface of the color separating lens array CSLA, such that the first wavelength light $L_{\lambda 1}$ and the second wavelength light $L_{\lambda 2}$ may be respectively condensed on the corresponding first pixel PX1 and the second pixel PX2. In detail, the first wavelength light $L_{\lambda 1}$ that has passed through the color separating lens array CSLA may have the first phase profile PP1 that is largest at the center of the first pixel corresponding region R1 and reduces away from the center of the first pixel corresponding region R1, that is, toward the second pixel corresponding regions R2. Such a phase profile is similar to a phase profile of light converging to one point after passing through a convex lens, e.g., a micro-lens having a convex center in the first wavelength light condensing region L1, and the first wavelength light $L_{\lambda 1}$ may be condensed onto the first pixel PX1. Also, the second wavelength light $L_{\lambda 2}$ that has passed through the color separating lens array CSLA has the second phase profile PP2 that is largest at the center of the second pixel corresponding region R2 and reduces away from the center of the second pixel corresponding region R2, e.g., toward the first pixel corresponding regions R1, and thus, the second wavelength light $L_{\lambda 2}$ may be condensed onto the second pixel PX2.

Because a refractive index of a material varies depending on a wavelength of light, the color separating lens array CSLA may provide different phase profiles with respect to the first and second wavelength light $L_{\lambda 1}$ and $L_{\lambda 2}$, as shown in FIG. 3B. In other words, because the same material has a different refractive index according to the wavelength of light reacting to the material and a phase delay of the light that passes through the material is different according to the wavelength, the phase profile may vary depending on the wavelength. For example, a refractive index of the first pixel corresponding region R1 with respect to the first wavelength light $L_{\lambda 1}$ and a refractive index of the first pixel corresponding region R1 with respect to the second wavelength light $L_{\lambda 2}$ may be different from each other, and the phase delay of the first wavelength light $L_{\lambda 1}$ passed through the first pixel corresponding region R1 and the phase delay of the second wavelength light $L_{\lambda 2}$ passed through the first pixel corresponding region R1 may be different from each other. Therefore, when the color separating lens array CSLA is designed based on the characteristics of light, different phase profiles may be provided with respect to the first wavelength light $L_{\lambda 1}$ and the second wavelength light $L_{\lambda 2}$.

The color separating lens array CSLA may include nanoposts NP that are arranged according to a certain rule such that the first and second wavelength light $L_{\lambda 1}$ and $L_{\lambda 2}$ may respectively have the first and second phase profiles PP1 and PP2. Here, the rule may be applied to parameters, such as the shape of the nanoposts NP, sizes (e.g., width and height), a distance between the nanoposts NP, and the arrangement form thereof, and these parameters may be determined according to a phase profile to be implemented by the color separating lens array CSLA.

A rule in which the nanoposts NP are arranged in the first pixel corresponding region R1, and a rule in which the nanoposts NP are arranged in the second pixel corresponding region R2 may be different from each other. In other words, sizes, shapes, intervals, and/or arrangement of the nanoposts NP in the first pixel corresponding region R1 may be different from those of the nanoposts NP in the second pixel corresponding region R2.

A cross-sectional diameter of the nanoposts NP may have a dimension of a sub-wavelength. Here, the sub-wavelength refers to a wavelength that is less than a wavelength band of light to be branched by the color separating lens array CSLA. The nanoposts NP may have a dimension that is less than a shorter wavelength of a first wavelength $\lambda 1$ and a second wavelength $\lambda 2$. When the incident light Li is a visible ray, the cross-sectional diameter of the nanoposts NP may be less than, for example, 400 nm, 300 nm, or 200 nm. In addition, a height of the nanoposts NP may be about 500 nm to about 1500 nm, which is greater than the cross-sectional diameter of the nanoposts NP. Although not shown in the drawings, the nanoposts NP may be obtained by combining two or more posts stacked in a height direction (e.g., Z direction).

The nanoposts NP may include a material having a higher refractive index than that of a peripheral material. For example, the nanoposts NP may include c-Si, p-Si, a-Si and a Group III-V compound semiconductor (e.g., GaP, GaN, GaAs etc.), SiC, $TiO_2$, SiN, and/or a combination thereof. The nanoposts NP having a different refractive index from that of the peripheral material may change the phase of light that passes through the nanoposts NP. This is caused by a phase delay that occurs due to the shape dimension of the sub-wavelength of the nanoposts NP, and a degree at which the phase is delayed, may be determined by a detailed shape dimension and arrangement shape of the nanoposts NP. A peripheral material of the nanoposts NP may include a dielectric material having a less refractive index than that of the nanoposts NP. For example, the peripheral material may include $SiO_2$ or air.

The first wavelength $\lambda 1$ and the second wavelength $\lambda 2$ may be in a wavelength band of infrared rays and visible rays. However, one or more embodiments are not limited thereto, and a variety of wavelength bands may be implemented according to the rule of arrays of the plurality of nanoposts NP. Also, it is described that two wavelengths are branched from the incident light and condensed as an example. However, embodiments are not limited thereto. The incident light may be branched into three directions or more according to wavelengths and condensed.

Also, the color separating lens array CSLA may include one single layer, or the color separating lens array CSLA may have a structure in which a plurality of layers are stacked. For example, a first layer may condense the visible ray toward a certain pixel and a second layer may condense the infrared ray toward another pixel.

Hereinafter, an example in which the color separating lens array CSLA described above is applied to the pixel array 1100 of the image sensor 1000 is described.

Figure 4A:
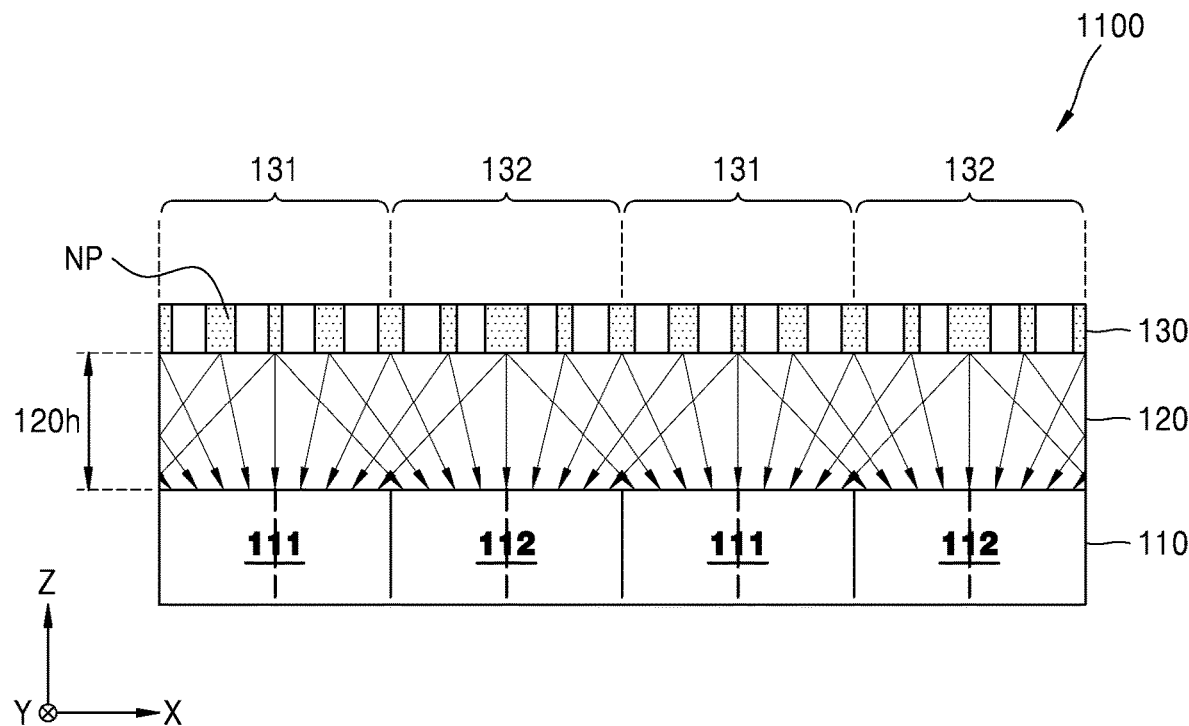
FIGS. 4A and 4B are cross-sectional views of a pixel array in an image sensor according to an embodiment, viewed from different directions.
Figure 4B:
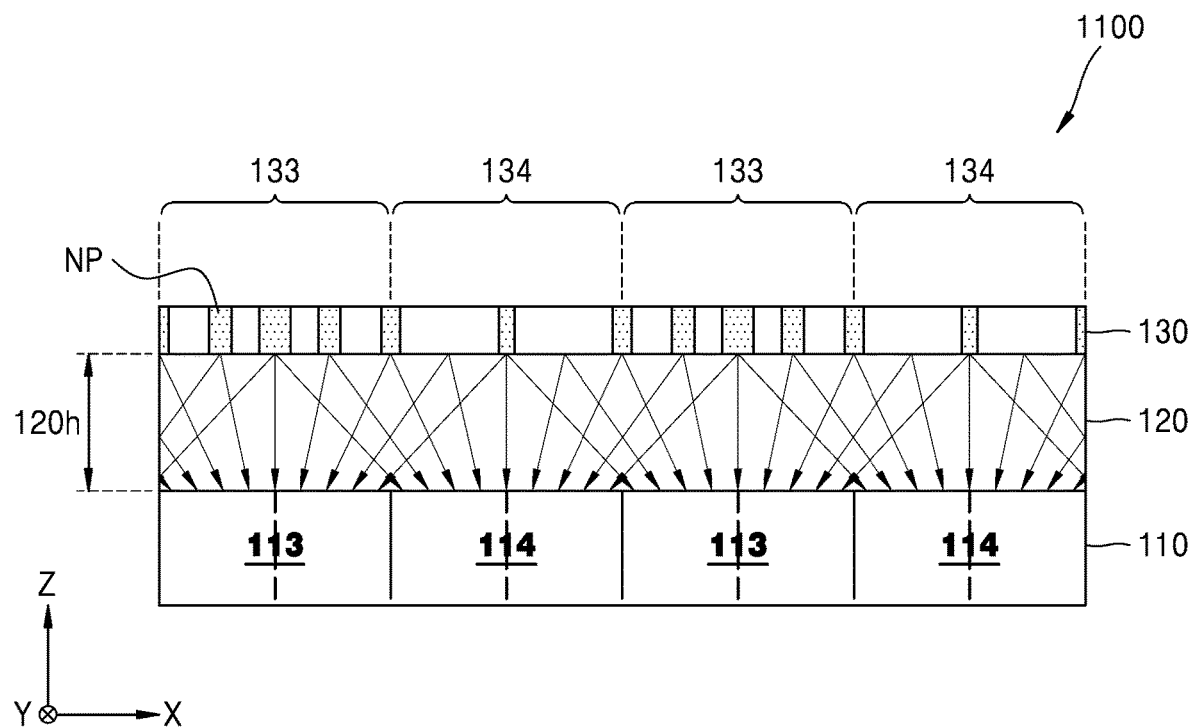
Figure 5A:
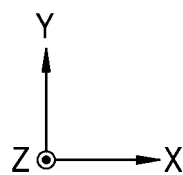
FIG. 5A is a plan view showing pixel arrangement in a pixel array according to an embodiment.
Figure 5B:
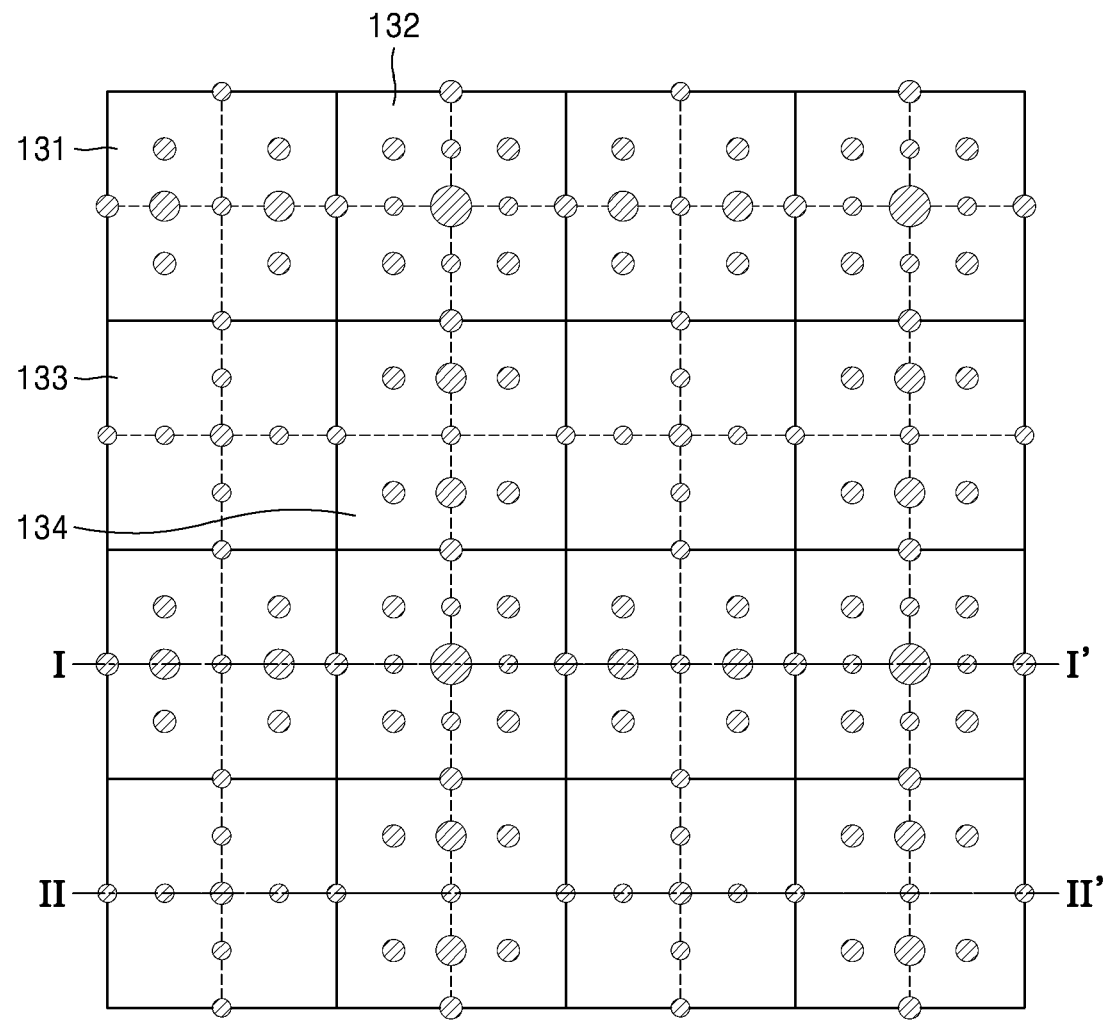
FIG. 5B is a plan view showing an example of arranging a plurality of nanoposts in a plurality of regions of a color separating lens array according to an embodiment.
Figure 5C:
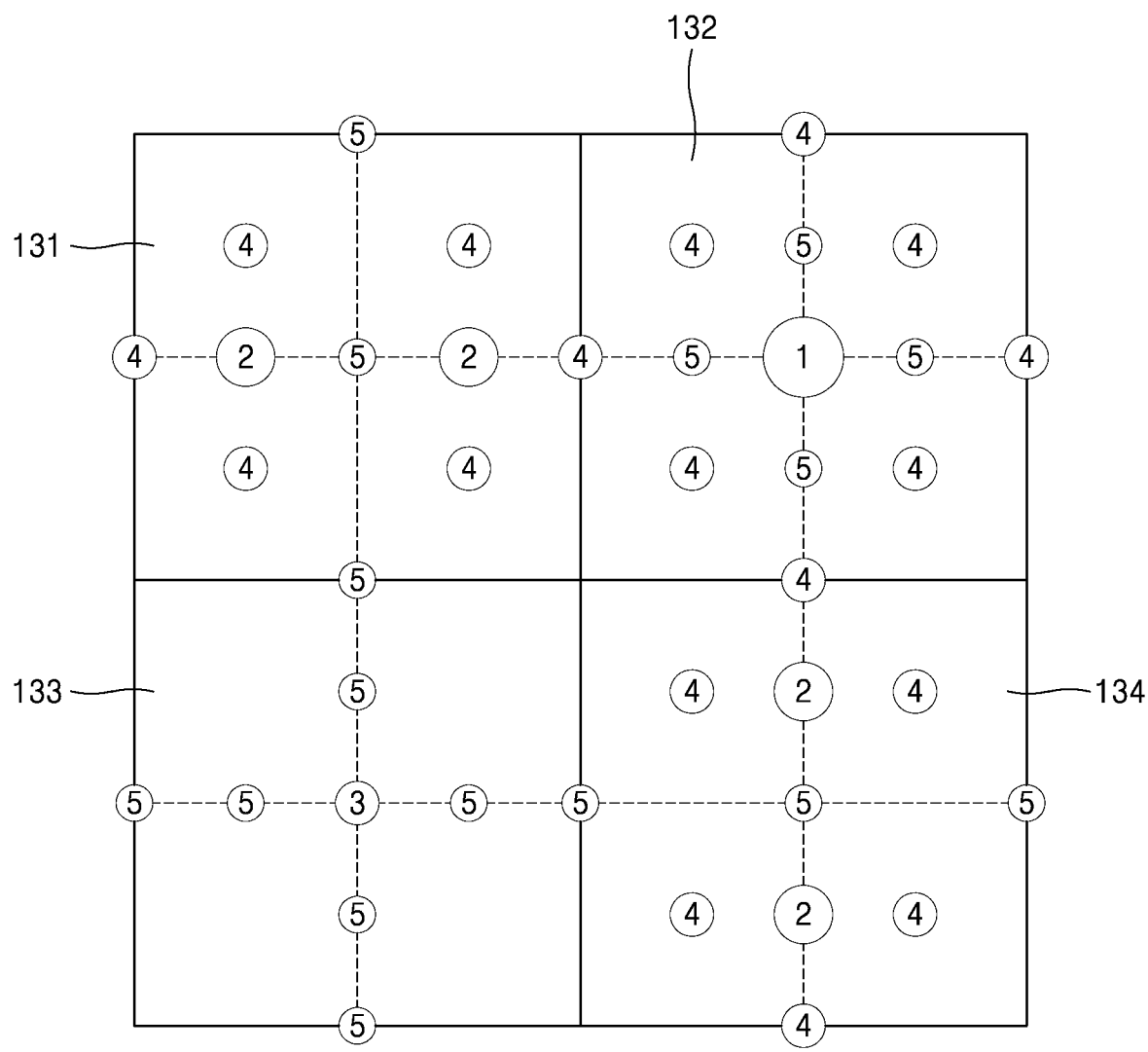
FIG. 5C is a plan view showing an enlarged view of a part in FIG. 5B.

FIGS. 4A and 4B are cross-sectional views of the pixel array 1100 in the image sensor 1000 viewed from different directions, FIG. 5A is a plan view showing an arrangement of pixels in the pixel array 1100 of the image sensor 1000, FIG. 5B is a plan view showing an example in which a plurality of nanoposts are arranged in a plurality of regions of the color separating lens array in the pixel array 1100 of the image sensor 1000, and FIG. 5C is a plan view showing an enlarged view of a part in FIG. 5B.

Referring to FIGS. 4A and 4B, the pixel array 1100 of the image sensor 1000 includes a sensor substrate 110 including a plurality of pixels 111, 112, 113, and 114 for sensing light, a transparent spacer layer 120 disposed on the sensor substrate 110, and a color separating lens array 130 on the spacer layer 120.

The sensor substrate 110 may include a first green pixel 111, a blue pixel 112, a red pixel 113, and a second green pixel 114 that convert light into electrical signals. In addition, the first green pixel 111 and the blue pixel 112 are alternately arranged in a first direction (e.g., X direction) as shown in FIG. 4A, and in a different cross-section as shown in FIG. 4B, the red pixel 113 and the second green pixel 114 may be alternately arranged. FIG. 5A shows the arrangement of pixels when the pixel array 1100 of the image sensor 1000 has the Bayer pattern arrangement as shown in FIG. 2A. The above arrangement is provided for separately sensing the incident light with unit patterns such as the Bayer pattern, for example, the first and second green pixels 111 and 114 may sense green light, the blue pixel 112 may sense blue light, and the red pixel 113 may sense red light. Although not shown in the drawings, a separator for separating cells may be further formed on a boundary between cells.

Referring to FIG. 5A, some or all of the pixels 111, 112, 113, and 114 may each include four or more photosensitive cells, and four or more photosensitive cells included in one pixel may share the light condensing regions of the color separating lens array. When a plurality of photosensitive cells that may independently sense signals are included in one pixel, a resolution of the image sensor may be improved. In addition, an auto-focusing function of the image sensor 1000 and/or a camera device including the image sensor 1000 may be implemented by using differences among signals obtained from the photosensitive cells. In the embodiment of FIG. 5A, when all of the green, blue, and red pixels 111, 112, 113, and 114 each include four photosensitive cells, for example, the first green pixel 111 includes 1-1st to 1-4th green light sensing cells 111a, 111b, 111c, and 111d, the blue pixel 112 includes first to fourth blue light sensing cells 112a, 112b, 112c, and 112d, the red pixel 113 includes first to fourth red light sensing cells 113a, 113b, 113c, and 113d, and the second green pixel 114 includes 2-1st to 2-4th green light sensing cells 114a, 114b, 114c, and 114d.

The spacer layer 120 is arranged between the sensor substrate 110 and the color separating lens array 130 in order to constantly maintain a distance between the sensor substrate 110 and the color separating lens array 130. The spacer layer 120 may include a material transparent with respect to the visible ray, for example, a dielectric material having a lower refractive index than that of the nanoposts NP and low absorption coefficient in the visible ray band, e.g., $SiO_2$, siloxane-based spin on glass (SOG), etc. A thickness 120h of the spacer layer 120 may be determined based on a focal distance of the light condensed by the color separating lens array 130, for example, may be about ½ of a focal distance of the light of a reference wavelength $\lambda_0$ as described later. A focal distance f of the reference wavelength light $\lambda_0$ condensed by the color separating lens array 130 may be expressed by equation 1 below, when a refractive index of the spacer layer 120 with respect to the reference wavelength $\lambda_0$ is n and a pitch between pixels is p.

$$f = \frac{np^2}{\lambda_0} - \frac{\lambda_0}{4n}$$

In an example, it is assumed that the reference wavelength $\lambda_0$ is 540 nm, e.g., green light, the pitch among the pixels 111, 112, 113, and 114 is 0.8 µm, and a refractive index n of the spacer layer 120 at the wavelength of 540 nm is 1.46. In this case, the focal distance f of the green light, that is, a distance between a lower surface of the color separating lens array 130 and a point where the green light is converged on a lower surface of the sensor substrate 110 may be about 1.64 µm and a thickness 120h of the spacer layer 120 may be about 0.82 µm. In another example, it is assumed that the reference wavelength $\lambda_0$ is 540 nm, e.g., green light, the pitch among the pixels 111, 112, 113, and 114 is 1.2 µm, and a refractive index n of the spacer layer 120 at the wavelength of 540 nm is 1.46. In this case, the focal distance f of the green light may be about 3.80 µm and the thickness 120h of the spacer layer 120 may be about 1.90 µm.

In other words, the thickness 120h of the spacer layer 120 described above may be about 70% to about 120% of the pixel pitch when the pixel pitch is about 0.5 µm to about 0.9 µm, and may be about 110% to about 180% of the pixel pitch when the pixel pitch is about 0.9 µm to about 1.3 µm.

The color separating lens array 130 may include the nanoposts NP, which are supported by the spacer layer 120 and configured to change a phase of the incident light, and may include a dielectric material, which is provided between the nanoposts NP and has a refractive index less than that of the nanoposts NP, e.g., air or $SiO_2$.

Referring to FIG. 5B, the color separating lens array 130 may be partitioned into four pixel corresponding regions 131, 132, 133, and 134 corresponding to the pixels 111, 112, 113, and 114 of FIG. 5A. A first green pixel corresponding region 131 corresponds to the first green pixel 111 and may be on the first green pixel 111 in a vertical direction, a blue pixel corresponding region 132 corresponds to the blue pixel 112 and may be on the blue pixel 112 in the vertical direction, a red pixel corresponding region 133 corresponds to the red pixel 113 and may be on the red pixel 113 in the vertical direction, and a second green pixel corresponding region 134 corresponds to the second green pixel 114 and may be on the second green pixel 114 in the vertical direction. That is, the pixel corresponding regions 131, 132, 133, and 134 of the color separating lens array 130 may be arranged facing the respective pixels 111, 112, 113, and 114 of the sensor substrate 110 in the vertical direction. The pixel corresponding regions 131, 132, 133, and 134 may be two-dimensionally arranged in the first direction (e.g., X direction) and the second direction (e.g., Y direction) such that a first row in which the first green pixel corresponding region 131 and the blue pixel corresponding region 132 are alternately arranged and a second row in which the red pixel corresponding region 133 and the second green pixel corresponding region 134 are alternately arranged are alternately repeated. The color separating lens array 130 includes a plurality of unit patterns that are two-dimensionally arranged like the pixel array of the sensor substrate 110, and each of the unit patterns includes the pixel corresponding regions 131, 132, 133, and 134 arranged in a 2×2 array.

In addition, similar to the above description with reference to FIG. 3B, the color separating lens array 130 may be partitioned as a green light condensing region for condensing the green light, a blue light condensing region for condensing the blue light, and a red light condensing region for condensing the red light.

The color separating lens array 130 may include the nanoposts NP, of which sizes, shapes, intervals, and/or arrangements are defined in a manner such that the green light is separated and condensed toward the first and second green pixels 111 and 114, the blue light is separately condensed toward the blue pixel 112, and the red light is separately condensed toward the red pixel 113. In addition, a thickness of the color separating lens array in a third direction (e.g., Z direction) may be similar to heights of the nanoposts NP, and may be about 500 nm to about 1500 nm.

Referring to FIG. 5B, the pixel corresponding regions 131, 132, 133, and 134 may include the nanoposts NP of cylindrical shapes each having a circular cross-section. In a center portion of each region, the nanoposts NP having different cross-sectional areas are arranged, and the nanoposts NP may be also arranged at the center on a boundary between pixels and a crossing point between the pixel boundaries.

FIG. 5C shows the arrangement of the nanoposts NP included in partial regions of FIG. 5B, that is, the pixel corresponding regions 131, 132, 133, and 134 in the unit pattern. In FIG. 5C, the nanoposts NP are indicated by 1 to 5 according to sizes of the cross-section of the unit pattern. Referring to FIG. 5C, from among the nanoposts NP, a nanopost 1 having the largest cross-sectional area is at the center of the blue pixel corresponding region 132, and nanoposts 5 having the smallest cross-sectional area may be arranged around the nanopost 1 and nanoposts 3 and at centers of the first and second green pixel corresponding region 131 and 134. However, one or more embodiments are not limited to the above example, and depending on embodiments, the nanoposts NP having various shapes, sizes, and arrangement may be applied.

The nanoposts NP included in the first and second green pixel corresponding regions 131 and 134 may have different distribution rules in the first direction (e.g., X direction) and the second direction (e.g., Y direction). For example, the nanoposts NP arranged in the first and second green pixel corresponding regions 131 and 134 may have different size arrangement in the first direction (X direction) and the second direction (Y direction). As shown in FIG. 5C, from among the nanoposts NP, a cross-sectional area of a nanopost 4 located at a boundary between the first green pixel corresponding region 131 and the blue pixel corresponding region 132 that is adjacent to the first green pixel corresponding region 131 in the first direction (X direction) is different from that of the nanoposts 5 located at a boundary between the first green pixel corresponding region 131 and the red pixel corresponding region 133 that is adjacent to the first green pixel corresponding region 131 in the second direction (Y direction). Likewise, a cross-sectional area of the nanopost 5 located at a boundary between the second green pixel corresponding region 134 and the red pixel corresponding region 133 that is adjacent to the second green pixel corresponding region 134 in the first direction (X direction) is different from that of the nanopost 4 located at a boundary between the second green pixel corresponding region 134 and the blue pixel corresponding region 132 that is adjacent to the second green pixel corresponding region 134 in the second direction (Y direction).

On the other hand, the nanoposts NP arranged in the blue pixel corresponding region 132 and the red pixel corresponding region 133 may have symmetrical arrangement rules along the first direction (X direction) and the second direction (Y direction). As shown in FIG. 5C, from among the nanoposts NP, the cross-sectional area of the nanoposts 4 at a boundary between the blue pixel corresponding region 132 and adjacent pixel corresponding regions in the first direction (X direction) and the cross-sectional areas of the nanoposts 4 at a boundary between the blue pixel corresponding region 132 and the adjacent pixel corresponding regions in the second direction (Y direction) are the same as each other, and in the red pixel corresponding region 133, the cross-sectional areas of the nanoposts 5 at a boundary between adjacent pixel corresponding regions in the first direction (X direction) and the cross-sectional areas of the nanoposts 5 at a boundary between the adjacent pixel corresponding regions in the second direction (Y direction) are the same as each other.

The above distribution is based on the pixel arrangement in the Bayer pattern. Adjacent pixels to the blue pixel 112 and the red pixel 113 in the first direction (X direction) and the second direction (Y direction) are the green pixels G, whereas the adjacent pixel to the first green pixel 111 in the first direction (X direction) is the blue pixel 112 and adjacent pixel to the first green pixel 111 in the second direction (Y direction) is the red pixel R. In addition, the adjacent pixel to the second green pixel 114 in the first direction (X direction) is the red pixel 113 and adjacent pixel to the second green pixel 114 in the second direction (Y direction) is the blue pixel 112. In addition, adjacent pixels to the first and second green pixels 111 and 114 in four diagonal directions are other green pixels, adjacent pixels to the blue pixel 112 in the four diagonal directions are the red pixels 113, and adjacent pixels to the red pixel 113 in the four diagonal directions are the blue pixels 112. Therefore, in the blue and red pixel corresponding regions 132 and 133 respectively corresponding to the blue pixel 112 and the red pixel 113, the nanoposts NP may be arranged in the form of 4-fold symmetry, and in the first and second green pixel corresponding regions 131 and 134, the nanoposts NP may be arranged in the form of 2-fold symmetry. In particular, the first and second green pixel corresponding regions 131 and 134 are rotated by 90° angle with respect to each other.

The plurality of nanoposts NP have symmetrical circular cross-sectional shapes in FIGS. 5B and 5C. However, some nanoposts having asymmetrical cross-sectional shapes may be included. For example, the first and second green pixel corresponding regions 131 and 134 may adopt the nanoposts having asymmetrical cross-sections, each of which has different widths in the first direction (X direction) and the second direction (Y direction), and the blue and red pixel corresponding regions 132 and 133 may adopt the nanoposts having symmetrical cross-sections, each of which has the same widths in the first direction (X direction) and the second direction (Y direction).

The arrangement rule of the nanoposts NP is an example, and is not limited thereto.

Figure 6A:
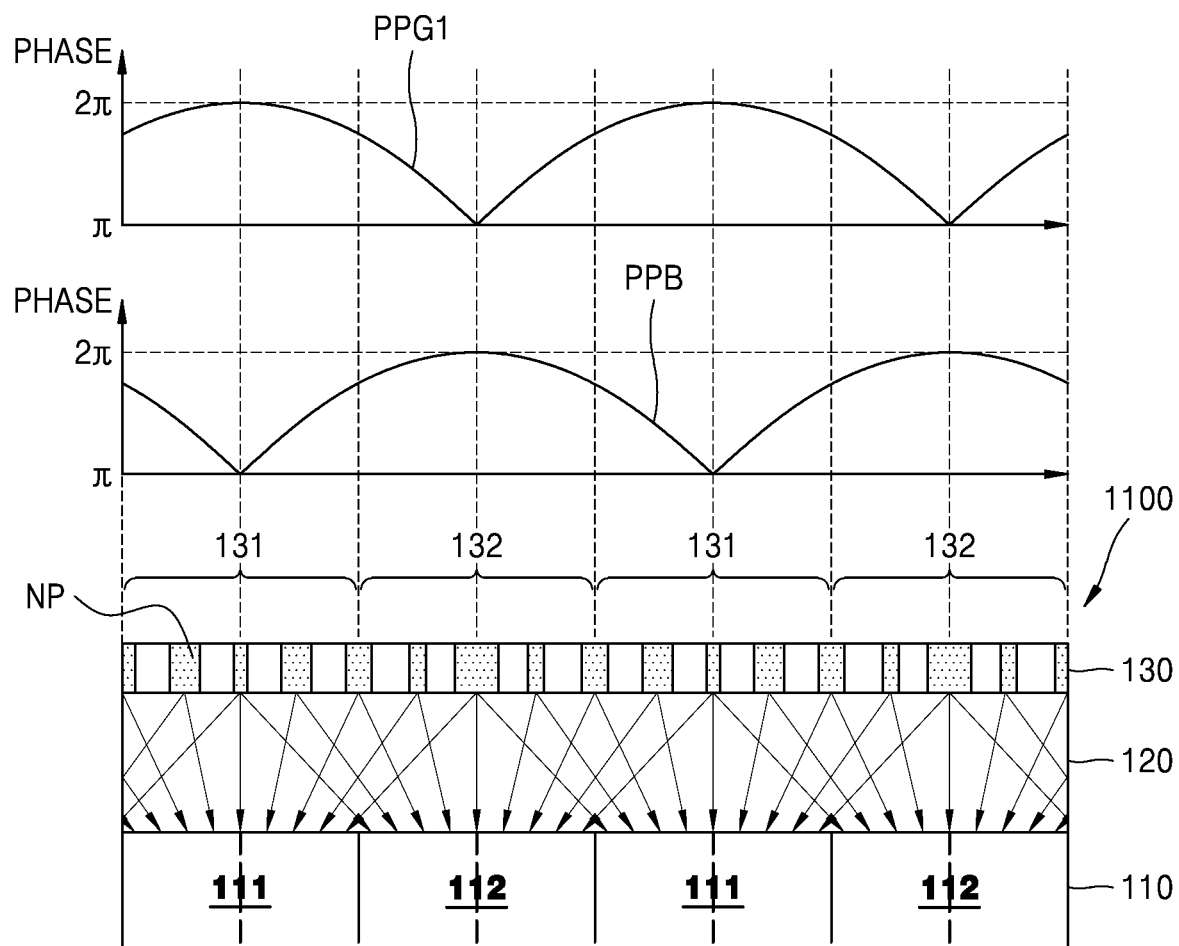
FIG. 6A is a diagram showing phase profiles of green light and blue light that have passed through a color separating lens array along line I-I' of FIG. 5B.
Figure 6B:
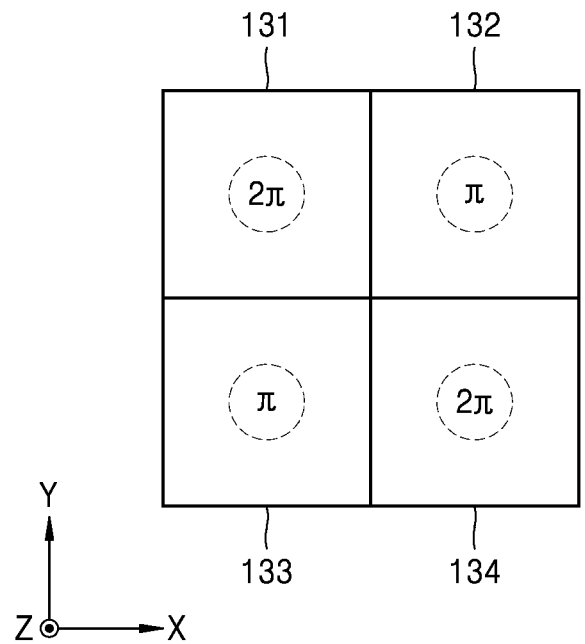
FIG. 6B is a diagram showing a phase of the green light that has passed through the color separating lens array of FIG. 5B at a center of pixel corresponding regions.
Figure 6C:
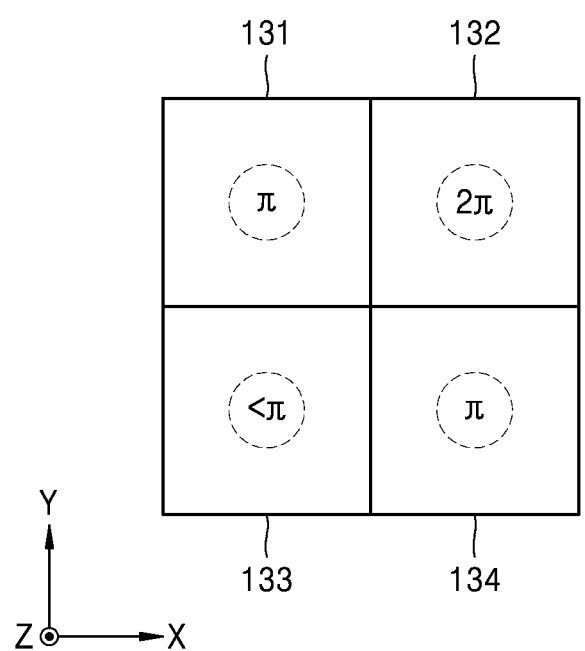
FIG. 6C is a diagram showing a phase of blue light that has passed through the color separating lens array of FIG. 5B at the center of pixel corresponding regions.

FIG. 6A shows phase profiles of the green light and the blue light that have passed through the color separating lens array 130 in line I-I' of FIG. 5B, FIG. 6B shows the phase of the green light that has passed through the color separating lens array 130 at centers of the pixel corresponding regions 131, 132, 133, and 134, and FIG. 6C shows the phase of the blue light that has passed through the color separating lens array 130 at the centers of the pixel corresponding regions 131, 132, 133, and 134. The phase profiles of the green light and the blue light shown in FIG. 6A are similar to those of the first and second wavelength light exemplary shown in FIG. 3B.

Referring to FIGS. 6A and 6B, the green light that has passed through the color separating lens array 130 may have a first green light phase profile PPG1 that is the largest at the center of the first green pixel corresponding region 131 and is reduced away from the center of the first green pixel corresponding region 131. In detail, immediately after passing through the color separating lens array 130, that is, at a lower surface of the color separating lens array 130 or an upper surface of the spacer layer 120, the phase of the green light is the largest at the center of the first green pixel corresponding region 131 and is reduced at a position of a larger concentric circle away from the center of the first green pixel corresponding region 131. Thus, the phase is the smallest at the centers of the blue and red pixel corresponding regions 132 and 133 in the X and Y directions, and at contact points between the first green pixel corresponding region 131 and the second green pixel corresponding region 134 in the diagonal direction. When a phase of the green light is set as a based on the phase of light emitted from the center of the first green pixel corresponding region 131, the light having a phase of about $0.9\pi$ to about $1.1\pi$ may be emitted from the centers of the blue and red pixel corresponding regions 132 and 133, and the light having a phase of about $1.1\pi$ to about $1.5\pi$ may be emitted from a contact point between the first green pixel corresponding region 131 and the second green pixel corresponding region 134. Therefore, a difference between the phase of the green light that has passed through the center of the first green pixel corresponding region 131 and the phase of the green light that has passed through the centers of the blue and red pixel corresponding regions 132 and 133 may be about $0.9\pi$ to about $1.1\pi$.

In addition, the first green light phase profile PPG1 does not denote that the phase delay amount of the light that has passed through the center of the first green pixel corresponding region 131 is the largest, but when the phase of light that has passed through the first green pixel corresponding region 131 is $2\pi$ and a phase delay amount of the light that has passed through another point is greater and has a phase value of $2\pi$ or greater, the first green light phase profile PPG1 may denote a value remaining after subtracting $2n\pi$, that is, wrapped phase profile. For example, when the phase of light that has passed through the first green pixel corresponding region 131 is $2\pi$ and the phase of light that has passed through the center of the blue pixel corresponding region 132 is $3\pi$, the phase in the blue pixel corresponding region 132 may be remaining $\pi$ after subtracting $2n\pi$ (n=1, i.e., $2\pi$) from $3\pi$.

Referring to FIGS. 6A and 6C, the blue light that has passed through the color separating lens array 130 may have a blue light phase profile PPB that is the largest at the center of the blue pixel corresponding region 132 and is reduced away from the center of the blue pixel corresponding region 132. In detail, immediately after passing through the color separating lens array 130, the phase of the blue light is the largest at the center of the blue pixel corresponding region 132 and is reduced at a position of a larger concentric circle away from the center of the blue pixel corresponding region 132, the phase is the smallest at the centers of the first and second green pixel corresponding regions 131 and 134 in the X direction and the Y direction and is the smallest at the center of the red pixel corresponding region 133 in the diagonal direction. When the phase of the blue light at the center of the blue pixel corresponding region 132 is $2\pi$, the phase at the centers of the first and second green pixel corresponding regions 131 and 134 may be about, for example, about $0.9\pi$ to about $1.1\pi$, and the phase at the center of the red pixel corresponding region 133 may be smaller than that at the centers of the first and second green pixel corresponding regions 131 and 134, for example, about 0.5π to about 0.9π.

Figure 6D:
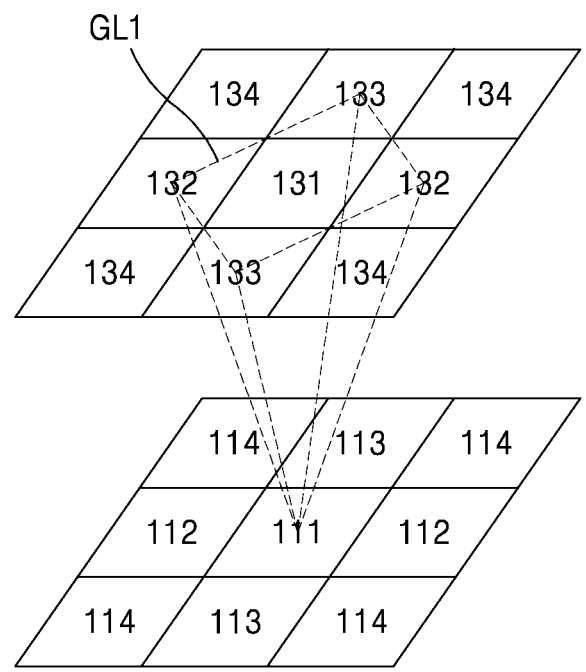
FIG. 6D is a diagram showing an example of a traveling direction of green light incident on a first green light condensing region according to an embodiment.
Figure 6E:
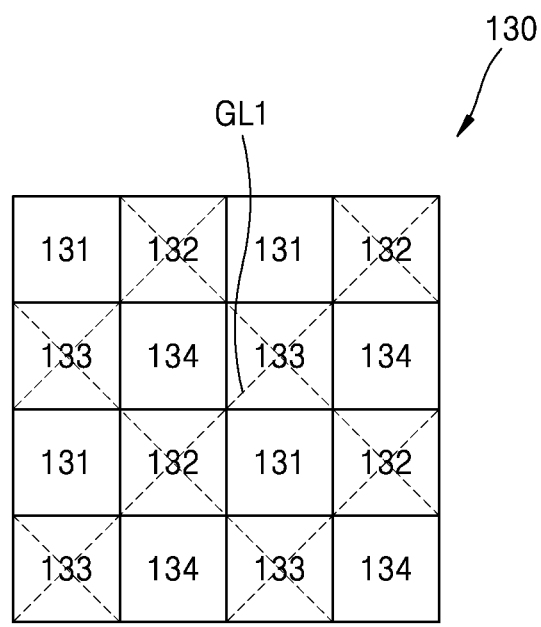
FIG. 6E is a diagram showing an example of an array of the first green light condensing region according to an embodiment.

FIG. 6D shows an example of a traveling direction of green light incident on a first green light condensing region, and FIG. 6E shows an example of an array of the first green light condensing region.

As shown in FIG. 6D, the green light incident on the vicinity of the first green pixel corresponding region 131 is condensed toward the first green pixel 111 by the color separating lens array 130, and the green light from the blue and red pixel corresponding regions 132 and 133, in addition to the first green pixel corresponding region 131, is also incident on the first green pixel 111. That is, according to the phase profile of the green light described above with reference to FIGS. 6A and 6B, the green light that has passed through a first green light condensing region GL1 that is obtained by connecting centers of two blue pixel corresponding regions 132 and two red pixel corresponding regions 133 that are adjacent to the first green pixel corresponding region 131 is condensed onto the first green pixel 111. Therefore, as shown in FIG. 6E, the color separating lens array 130 may operate as a first green light condensing region array for condensing the green light onto the first green pixel 111. The first green light condensing region GL1 may have a greater area than that of the corresponding first green pixel 111, e.g., may be 1.2 times to two times greater than that of the first green pixel 111.

Figure 6F:
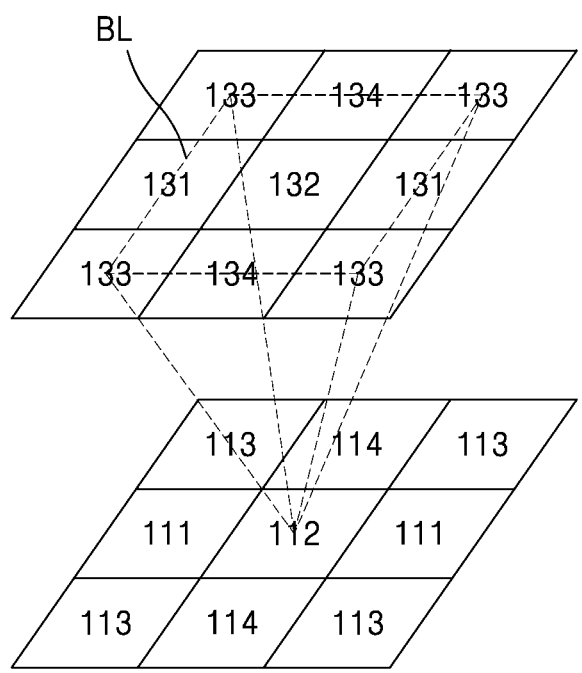
FIG. 6F is a diagram showing an example of a traveling direction of blue light incident on a blue light condensing region according to an embodiment.

FIG. 6F shows an example of a traveling direction of blue light incident on a first blue light condensing region, and FIG. 6E shows an example of an array of the blue light condensing region.

Figure 6G:
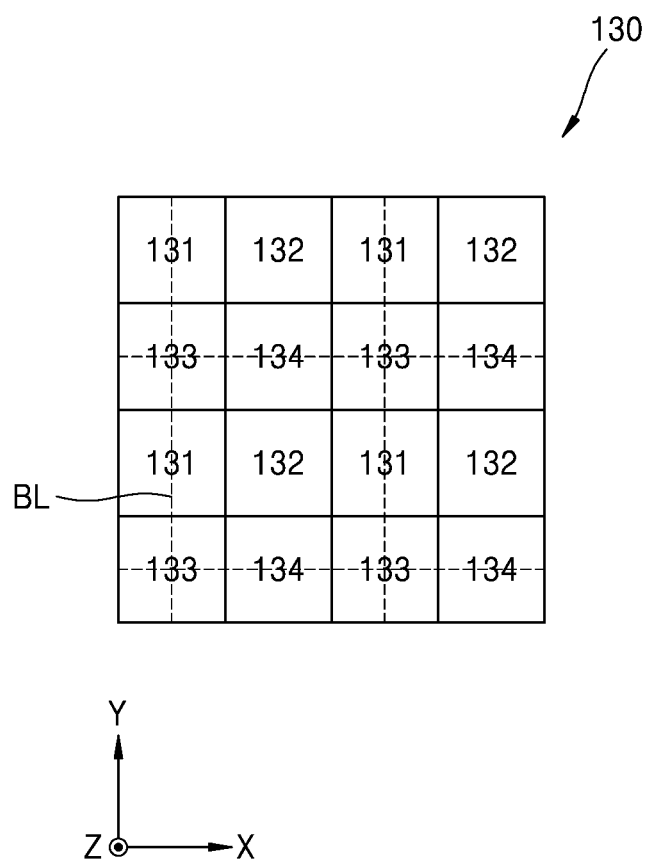
FIG. 6G is a diagram showing an example of an array of the blue light condensing region according to an embodiment.

The blue light is condensed onto the blue pixel 112 by the color separating lens array 130 as shown in FIG. 6F, and the blue light from the pixel corresponding regions 131, 132, 133, and 134 is incident on the blue pixel 112. In the phase profile of the blue light described above with reference to FIGS. 6A and 6C, the blue light that has passed through a blue light condensing region BL that is obtained by connecting centers of four red pixel corresponding regions 133 adjacent to the blue pixel corresponding region 132 at vertices of the blue pixel corresponding region 132 is condensed onto the blue pixel 112. Therefore, as shown in FIG. 6G, the color separating lens array 130 may operate as a blue light condensing region array for condensing the blue light to the blue pixel. The blue light condensing region BL has an area greater than that of the blue pixel 112, e.g., may be 1.5 to 4 times greater. The blue light condensing region BL may partially overlap the first green light condensing region GL1 described above, and a second green light condensing region GL2 and a red light condensing region RL, which will be described later.

FIGS. 7A to 7G are diagrams for describing the relationship between a thickness of the spacer layer 120 and a region where the light is condensed.

Figure 7A:
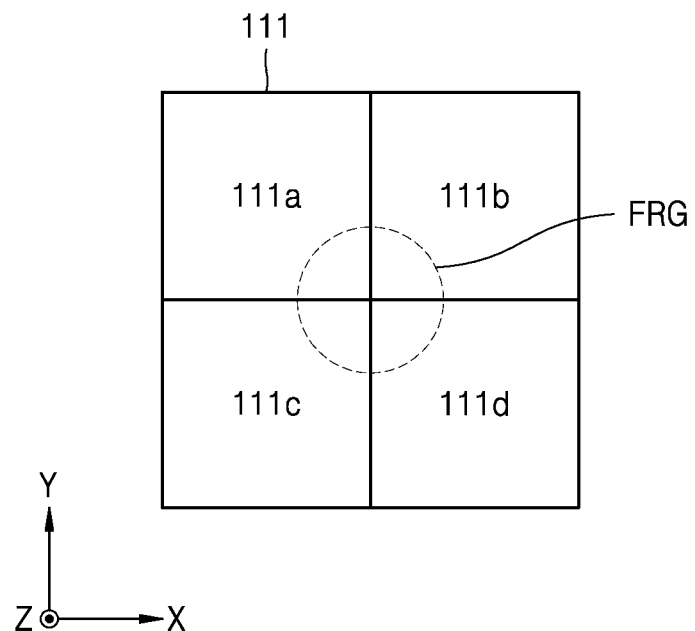
FIGS. 7A to 7F are diagrams for describing a relationship between a thickness of a spacer layer and a region where light is condensed.

FIG. 7A is a diagram for describing a region where the green light is condensed, when a thickness of the spacer layer 120 is similar to a focal distance of the green light condensing region. Referring to FIG. 7A, because a thickness 120h of the spacer layer 120, e.g., a distance between the color separating lens array 130 and the sensor substrate 110, is similar to a focal distance of the first green light condensing region GL1, the green light may be condensed onto a green light focused region FRG that is indicated as a circle at the center of the green pixel 111. As the thickness of the spacer layer 120 is close to the focal distance of the first green light condensing region GL1, a size of the green light focused region FRG may be reduced. The first green pixel 111 may include four photosensitive cells 111a, 111b, 111c, and 111d, and a barrier wall for preventing crosstalk may be installed between two adjacent photosensitive cells. Therefore, a large number of photons condensed onto the green light focused region FRG is incident on the barrier wall between the photosensitive cells, and the photons incident in the barrier wall are reflected or scattered and not sensed by the photosensitive cells. Thus, this may cause degradation in light utilization efficiency of the sensor substrate 110.

Figure 7B:
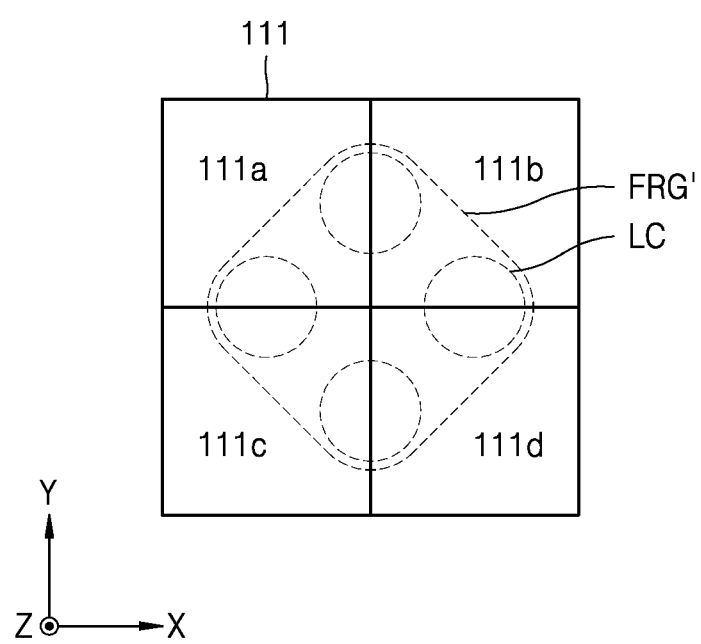

FIG. 7B is a diagram for describing a region where the green light is condensed, when a thickness of the spacer layer 120 is about ½ of the focal distance of the first green light condensing region GL1. Referring to FIG. 7B, because the thickness 120h of the spacer layer 120 is less than the focal distance of the first green light condensing region GL1, the green light may be condensed on a green light focused region FRG' having an enlarged area as compared with the green light focused region FRG of FIG. 7A. In particular, the green light may be concentrated on four light concentration portions LC that are indicated as circles among the photosensitive cells 111a, 111b, 111c, and 111d. In the green light focused region FRG', more light is incident on portions of the photosensitive cells 111a, 111b, 111c, and 111d (that is, portions in which the barrier walls are not provided) as compared with the green light focused region FRG of FIG. 7A, and less light is incident on the center of the first green pixel 111 where the barrier walls intersect each other. Thus, the number of photons that are lost because they are reflected or scattered by the barrier walls may be reduced. In other words, in a structure in which one pixel includes four photosensitive cells, when the thickness 120h of the spacer layer 120 is designed to be ½ of the focal distance of the light condensing region, the light utilization efficiency of the sensor substrate 110 may be improved as compared with a case in which the thickness 120h of the spacer layer 120 is set as the focal distance of the light condensing region.

According to example embodiments, to improve the light utilization efficiency of the sensor substrate 110, the thickness of the spacer layer 120, e.g., the distance between the color separating lens array 130 and the sensor substrate 110, may be about 30% to about 70% or 40% to about 60% of the reference wavelength light focal distance due to the color separating lens array 130. However, the embodiments are not limited to this example and the thickness of the spacer layer 120 may be freely set as long as the thickness of the spacer layer 120 is less than the focal distance of the light condensing region.

For example, the thickness of the spacer layer 120, that is, the distance between the color separating lens array 130 and the sensor substrate 110, may be about 110% to about 180% of the pixel pitch when the pixel pitch of the sensor substrate 110 is about 0.9 μm to about 1.3 μm, or may be about 70% to about 120% of the pixel pitch of the sensor substrate 110 when the pixel pitch of the sensor substrate 110 is about 0.5 μm to about 0.9 μm.

Figure 7C:
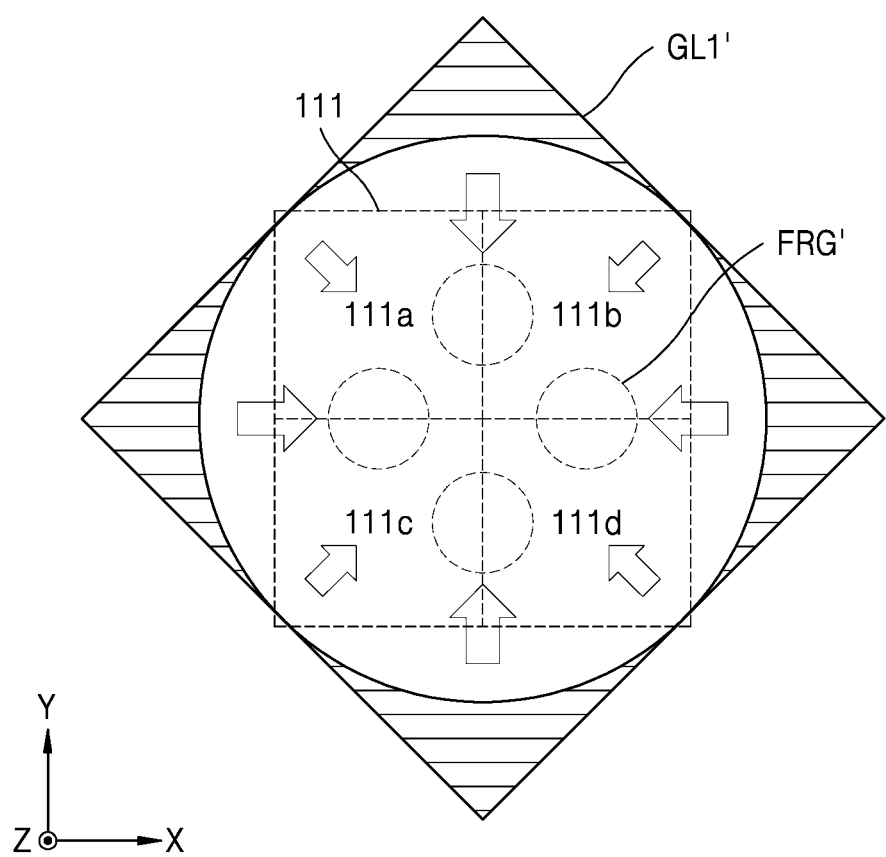

FIG. 7C is a diagram for describing the light concentration portion of the green light focused region FRG' of FIG. 7B. Referring to FIG. 7C, the first green light condensing region GL1' of the color separating lens array 130 and the green pixel 111 of the sensor substrate 110 are shown. Similar to the first green light condensing region GL1 described above with reference to FIGS. 6D and 6E, the first green light condensing region GL1' may have a rectangular shape, and may be rotated by 45 angle with respect to the green pixel 111. Because an amount of the light incident on vertex regions of the first green light condensing region GL1', which are shaded in FIG. 7, is relatively greater than that of the light coming from another direction, e.g., from a center direction of each side, of the first green light condensing region GL1', the light may be concentrated toward the vertex directions of the first green light condensing region GL1' and light concentration portions LC may be formed in a '+' array form. That is, the arrangement of the green light focused regions FRG' may be determined according to the shape and arrangement of the first green light condensing region GL1'. Due to the shape and the arrangement of the first green light condensing region GL1', four light concentration portions LC may be formed between two adjacent photosensitive cells.

Figure 7D:
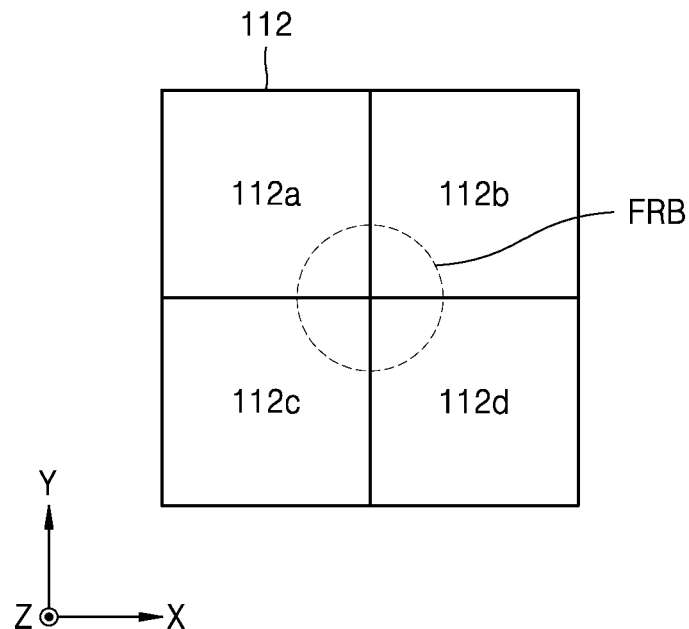

FIG. 7D is a diagram for describing a region where the blue light is condensed, when a thickness of the spacer layer is similar to a focal distance of the blue light condensing region. Referring to FIG. 7D, the blue light may be condensed onto a blue light focused region FRB that is indicated as a circle at the center of the blue pixel 112. Like in a green light focused region FRG shown in FIG. 7A, many of photons condensed onto the blue light focused region FRB are incident on barrier walls among photosensitive cells 112a, 112b, 112c, and 112d, and photons incident in the barrier walls are reflected or scattered and not sensed by the photosensitive cells. Thus, this may be a cause of degradation in an optical efficiency of the sensor substrate 110.

Figure 7E:
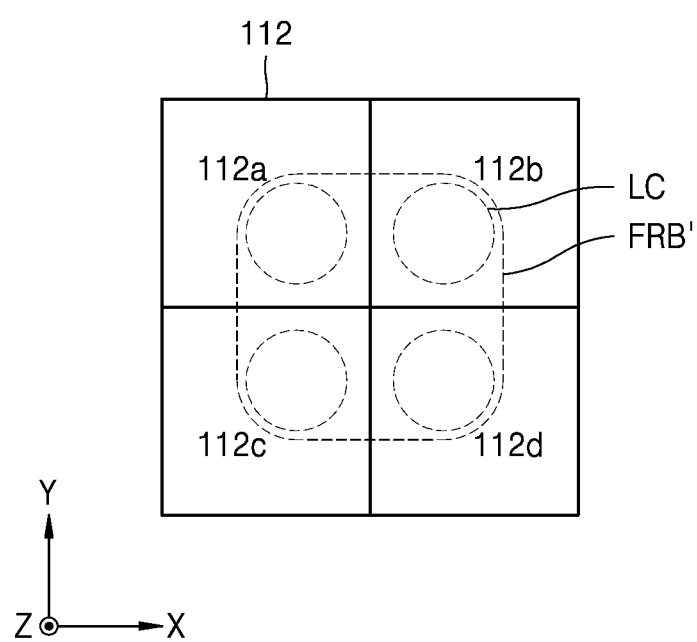

FIG. 7E is a diagram for describing a region where the blue light is condensed, when a thickness of the spacer layer is about ½ of a focal distance of the blue light condensing region. Referring to FIG. 7E, the blue light may be condensed on a blue light focused region FRB' having an enlarged area as compared with the blue light focused region FRB of FIG. 7D. In particular, the blue light may be concentrated on light concentration portions LC that are indicated as circles at the photosensitive cells 112a, 112b, 112c, and 112d. In the blue light focused region FRB', more light is incident on portions of the photosensitive cells 112a, 112b, 112c, and 112d (that is, portions in which the barrier walls are not provided) as compared with the blue light focused region FRB of FIG. 7D, and less light is incident on the center of the blue pixel 112 where the barrier walls intersect each other. Thus, the light utilization efficiency may be improved.

Figure 7F:
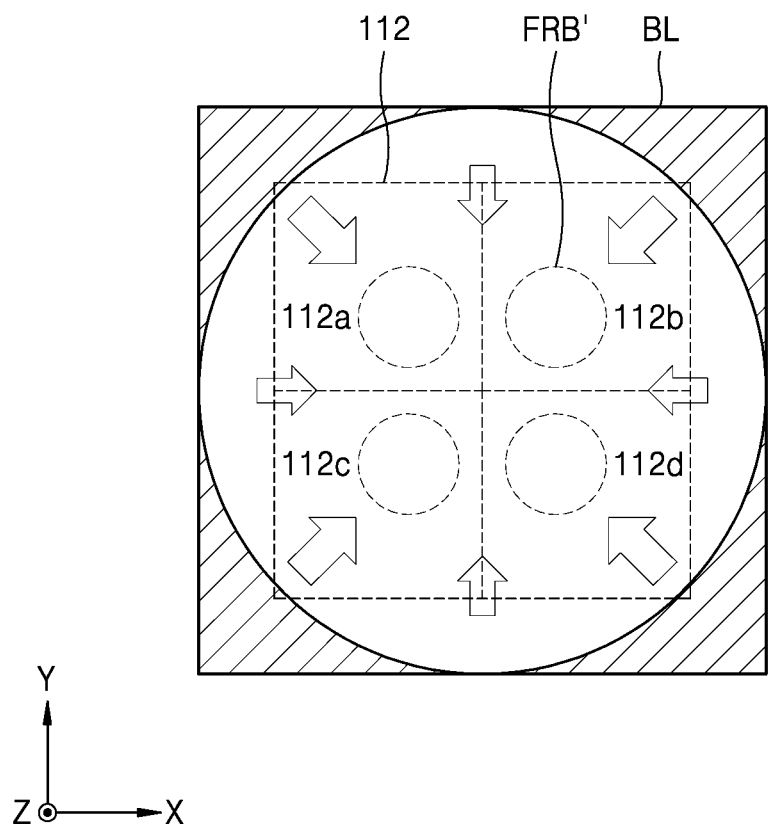

FIG. 7F is a diagram for describing the blue light focused region FRB' of FIG. 7E. Referring to FIG. 7F, a blue light condensing region BL of the color separating lens array 130 and the blue pixel 112 of the sensor substrate 110 are shown. Similar to the first green light condensing region GL1 described above with reference to FIGS. 6D and 6E, the blue light condensing region BL may have a rectangular shape, and may be arranged in the same direction as the blue pixel 112, that is, each side of the blue light condensing region BL may be in parallel with each side of the blue pixel 112. Due to the arrangement and shape of the blue light condensing region BL, the light is concentrated toward the vertex directions of the blue light condensing region BL, and then, light concentration portions LC arranged in an 'x' shape may be formed.

Figure 8A:
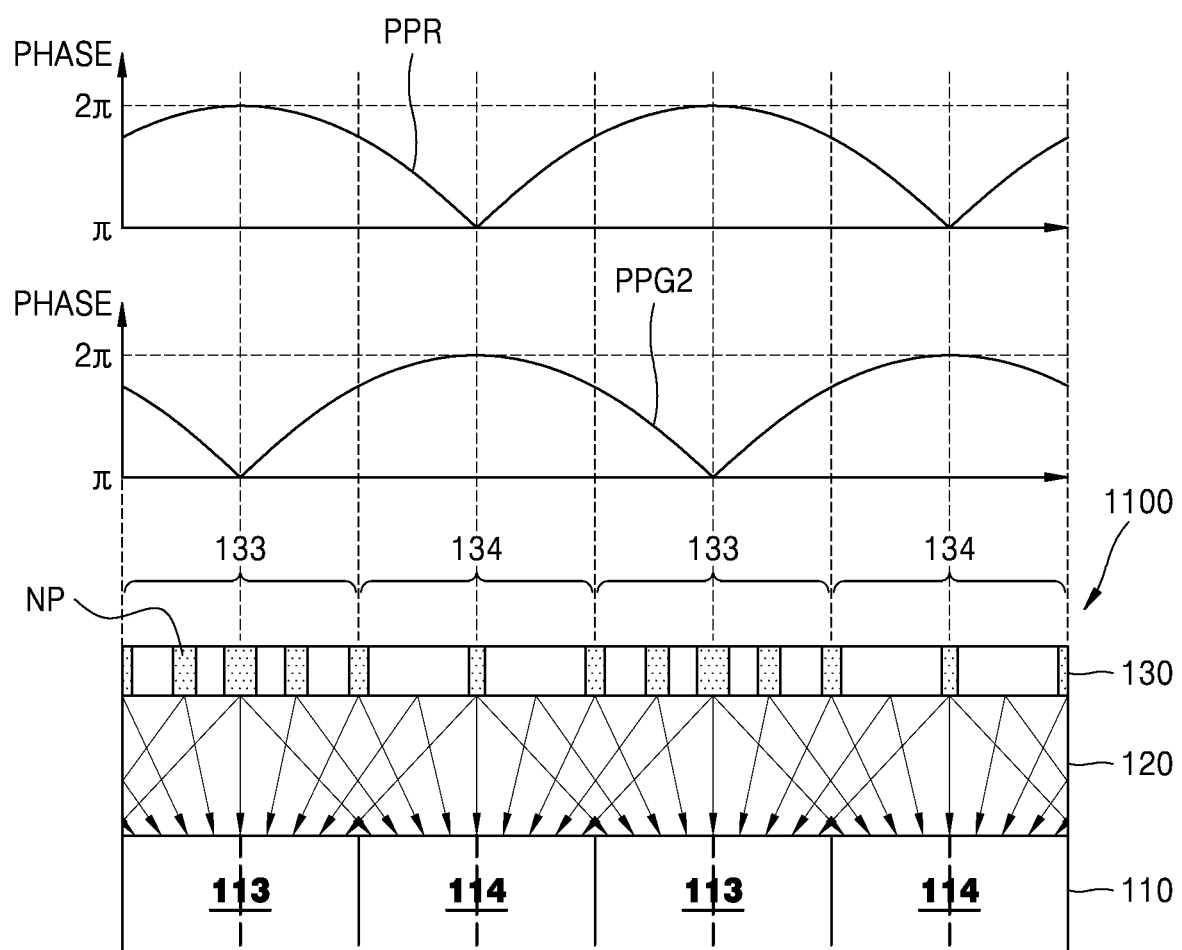
FIG. 8A is a diagram showing phase profiles of red light and green light that have passed through a color separating lens array along line II-II' of FIG. 5B.
Figure 8B:
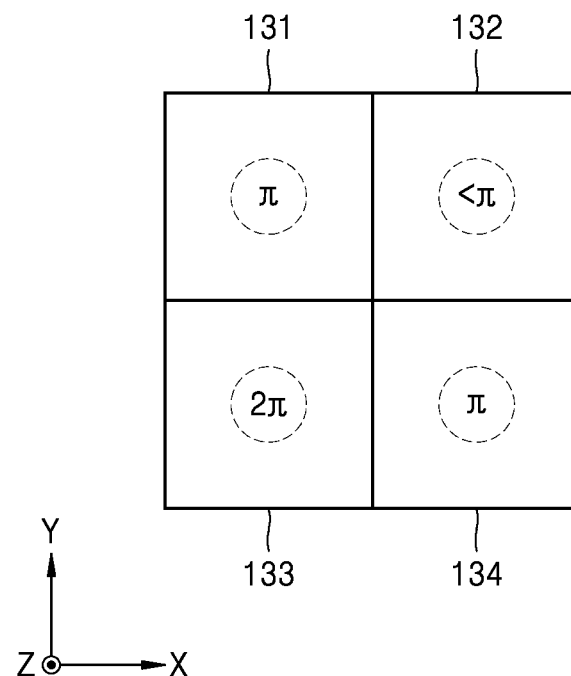
FIG. 8B is a diagram showing a phase of the red light that has passed through the color separating lens array of FIG. 5B at a center of pixel corresponding regions.
Figure 8C:
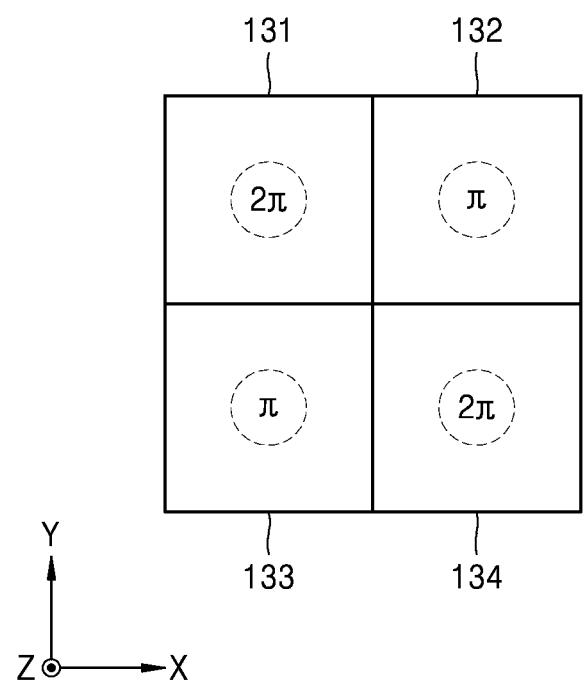
FIG. 8C is a diagram showing a phase of green light that has passed through the color separating lens array of FIG. 5B at the center of pixel corresponding regions.

FIG. 8A shows phase profiles of the green light and the blue light that have passed through the color separating lens array 130 in line II-II' of FIG. 5B, FIG. 8B shows the phase of the red light that has passed through the color separating lens array 130 at centers of the pixel corresponding regions 131, 132, 133, and 134, and FIG. 8C shows the phase of the green light that has passed through the color separating lens array 130 at the centers of the pixel corresponding regions 131, 132, 133, and 134.

Referring to FIGS. 8A and 8B, the red light that has passed through the color separating lens array 130 may have a red light phase profile PPR that is the largest at the center of the red pixel corresponding region 133 and is reduced away from the center of the red pixel corresponding region 133. In detail, immediately after passing through the color separating lens array 130, the phase of the red light is the largest at the center of the red pixel corresponding region 133 and is reduced at a position of a larger concentric circle away from the center of the red pixel corresponding region 133. The phase of the red light is the smallest at the centers of the first and second green pixel corresponding regions 131 and 134 in the X direction and the Y direction and is the smallest at the center of the blue pixel corresponding region 132 in the diagonal direction. When the phase of the red light at the center of the red pixel corresponding region 133 is $2\pi$, the phase at the centers of the first and second green pixel corresponding regions 131 and 134 may be about, for example, about $0.9\pi$ to about $1.1\pi$, and the phase at the center of the blue pixel corresponding region 132 may be smaller than that at the centers of the first and second green pixel corresponding regions 131 and 134, for example, about $0.6n$ to about $0.9\pi$.

Referring to FIGS. 8A and 8C, the green light that has passed through the color separating lens array 130 may have a second green light phase profile PPG2 that is the largest at the center of the second green pixel corresponding region 134 and is reduced away from the center of the second green pixel corresponding region 134. When comparing the first green light phase profile PPG1 of FIG. 6A with the second green light phase profile PPG2 of FIG. 8A, the second green light phase profile PPG2 is obtained by moving in parallel the first green light phase profile PPG1 by one-pixel pitch in the X direction and the Y direction. That is, the first green light phase profile PPG1 has the largest phase at the center of the first green pixel corresponding region 131, and the second green light phase profile PPG2 has the largest phase at the center of the second green pixel corresponding region 134 that is apart by one-pixel pitch from the center of the first green pixel corresponding region 131 in the X direction and the Y direction. The phase profiles in FIGS. 6B and 8C showing the phases at the centers of the pixel corresponding regions 131, 132, 133, and 134 may be the same as each other. Regarding the phase profile of the green light based on the second green pixel corresponding region 134, when the phase of the green light emitted from the center of the second green pixel corresponding region 134 is set as $2\pi$, the light having the phase of about $0.9\pi$ to about $1.1\pi$ may be emitted from the centers of the blue and red pixel corresponding regions 132 and 133 and the light having the phase of about $1.1\pi$ to about $1.5\pi$ may be emitted from the contact point between the first green pixel corresponding region 131 and the second green pixel corresponding region 134.

Figure 8D:
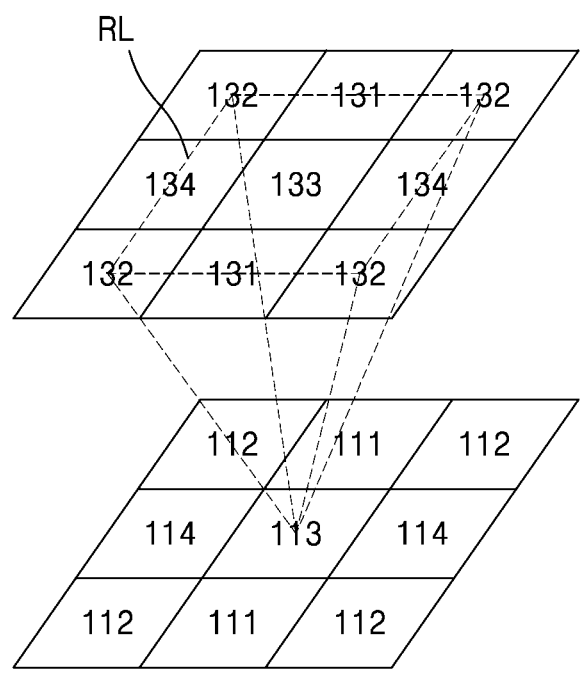
FIG. 8D is a diagram showing an example of a traveling direction of red light incident on a red light condensing region according to an embodiment.
Figure 8E:
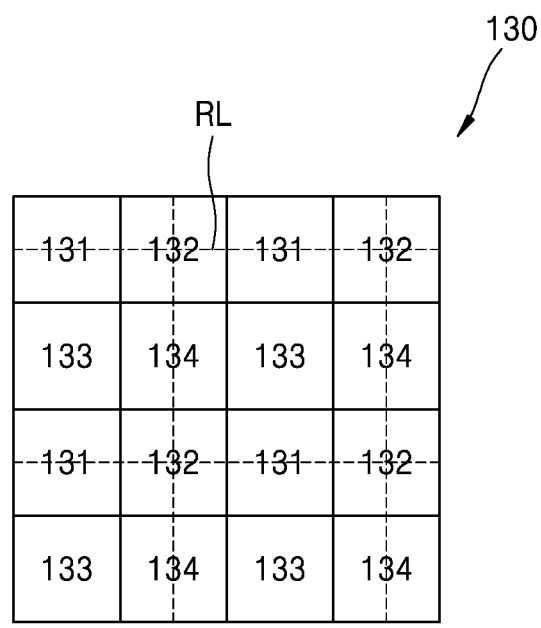
FIG. 8E is a diagram showing an example of an array of the red light condensing region according to an embodiment.

FIG. 8D shows an example of a traveling direction of red light incident on a red light condensing region, and FIG. 8E shows an example of an array of the red light condensing region.

The red light is condensed onto the red pixel 113 by the color separating lens array 130 as shown in FIG. 8D, and the red light from the pixel corresponding regions 131, 132, 133, and 134 is incident on the red pixel 113. In the phase profile of the red light described above with reference to FIGS. 8A and 8B, the red light that has passed through a red light condensing region RL that is obtained by connecting centers of four blue pixel corresponding regions 132 adjacent to the red pixel corresponding region 133 at vertices is condensed onto the red pixel 113. Therefore, as shown in FIG. 8E, the color separating lens array 130 may operate as a red light condensing region array for condensing the red light to the red pixel. The red light condensing region RL has an area greater than that of the red pixel 113, e.g., may be 1.5 to 4 times greater. The red light condensing region RL may partially overlap the first and second green light condensing regions GL1 and GL2 and the blue light condensing region BL.

Figure 8F:
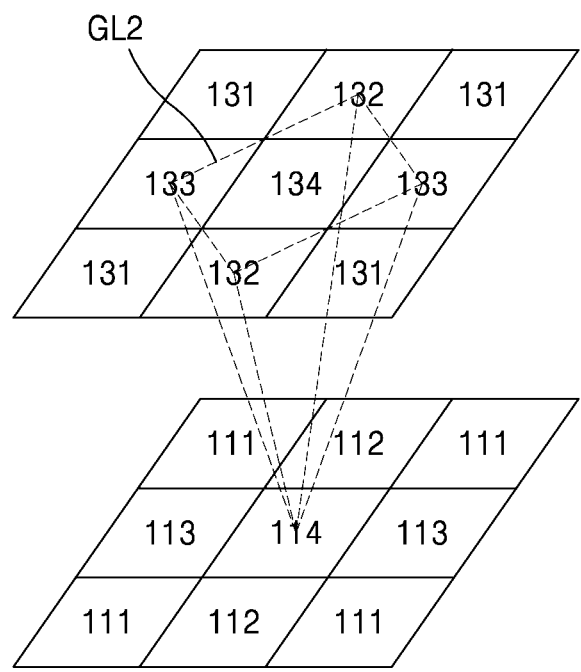
FIG. 8F is a diagram showing an example of a traveling direction of green light incident on a second green light condensing region according to an embodiment.
Figure 8G:
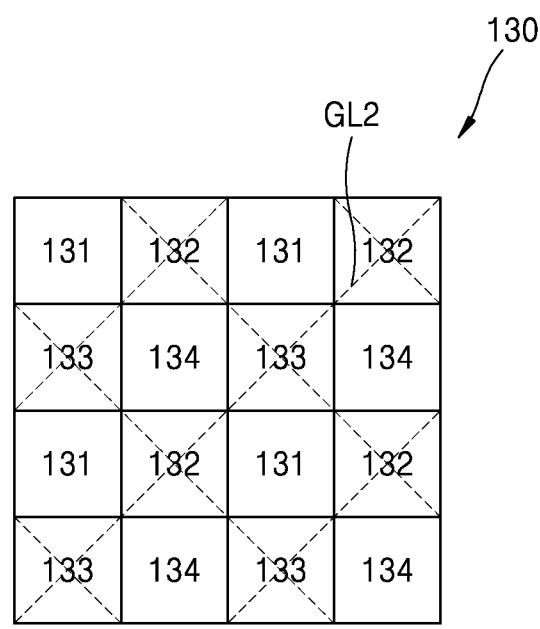
FIG. 8G is a diagram showing an example of an array of the second green light condensing region according to an embodiment.

FIG. 8F is a diagram showing an example of a traveling direction of green light incident on a second green light condensing region, and FIG. 8G is a diagram showing an example of an array of the second green light condensing region.

Referring to FIGS. 8F and 8G, the green light incident on the vicinity of the second green pixel corresponding region 134 proceeds similarly to the green light incident on the vicinity of the first green pixel corresponding region 131, and as shown in FIG. 8F, the green light is condensed onto the second green pixel 114. Therefore, as shown in FIG. 8G, the color separating lens array 130 may operate as a second green light condensing region array for condensing the green light onto the second green pixel 114. The second green light condensing region GL2 may have a greater area than that of the corresponding second green pixel 114, e.g., may be 1.2 times to twice greater.

According to the image sensor 1000 including the pixel array 1100 described above, light loss due to a color filter, e.g., an organic color filter, rarely occurs, and thus, a sufficient amount of light may be provided to the pixels even when the pixels become smaller. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic apparatuses. The electronic apparatuses may include, for example, smartphones, mobile phones, cell phones, personal digital assistants (PDAs), laptop computers, personal computers (PCs), a variety of portable devices, electronic apparatuses, surveillance cameras, medical camera, automobiles, Internet of Things (IoT) devices, other mobile or non-mobile computing devices and are not limited thereto.

The electronic apparatuses may further include, in addition to the image sensor 1000, a processor for controlling the image sensor, for example, an application processor (AP), and may control a plurality of hardware or software elements and may perform various data processes and operations by driving an operation system or application programs via the processor. The processor may further include a graphic processing unit (GPU) and/or an image signal processor. When an image signal processor is included in the processor, an image (or video) obtained by the image sensor may be stored and/or output by using the processor.

Figure 9:
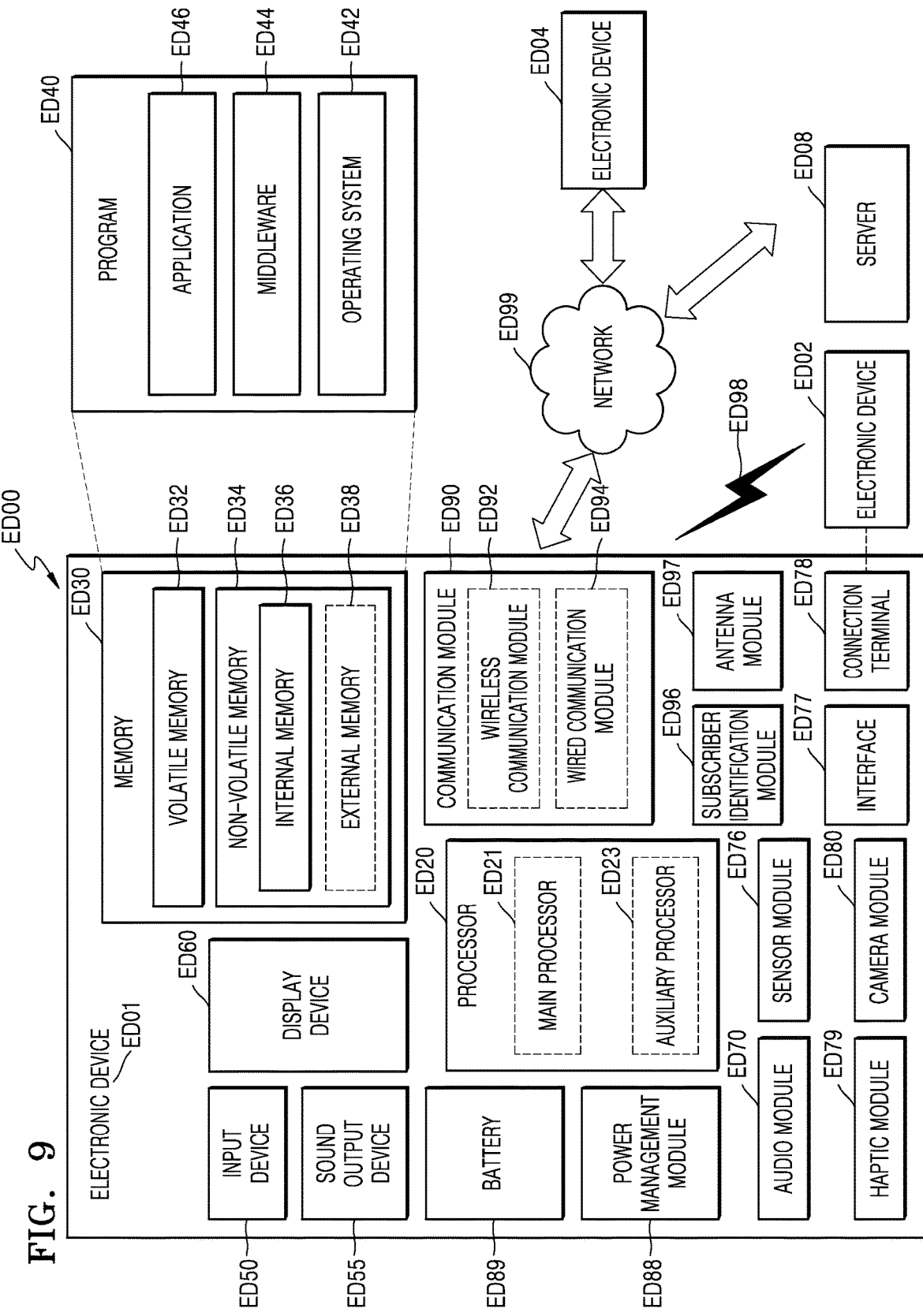
FIG. 9 is a block diagram of an electronic apparatus including an image sensor according to one or more embodiments.

FIG. 9 is a block diagram showing an example of an electronic apparatus ED01 including the image sensor 1000. Referring to FIG. 9, in a network environment ED00, the electronic apparatus ED01 may communicate with another electronic apparatus ED02 via a first network ED98 (e.g., short-range wireless communication network, etc.), or may communicate with another electronic apparatus ED04 and/or a server ED08 via a second network ED99 (e.g., long-range wireless communication network, etc.) The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (e.g., display device ED60, etc.) of the elements may be omitted or another element may be added. Some of the elements may be configured as one integrated circuit. For example, the sensor module ED76 (e.g., a fingerprint sensor, an iris sensor, an illuminance sensor, etc.) may be embedded and implemented in the display device ED60 (e.g., display, etc.)

The processor ED20 may control one or more elements (e.g., hardware, software elements, etc.) of the electronic apparatus ED01 connected to the processor ED20 by executing software (e.g., program ED40, etc.), and may perform various data processes or operations. As a part of the data processing or operations, the processor ED20 may load a command and/or data received from another element (e.g., sensor module ED76, communication module ED90, etc.) to a volatile memory ED32, may process the command and/or data stored in the volatile memory ED32, and may store result data in a non-volatile memory ED34. The processor ED20 may include a main processor ED21 (e.g., central processing unit, application processor, etc.) and an auxiliary processor ED23 (e.g., graphic processing unit, image signal processor, sensor hub processor, communication processor, etc.) that may be operated independently from or along with the main processor ED21. The auxiliary processor ED23 may use less power than that of the main processor ED21, and may perform specified functions.

The auxiliary processor ED23, on behalf of the main processor ED21 while the main processor ED21 is in an inactive state (e.g., sleep state) or along with the main processor ED21 while the main processor ED21 is in an active state (e.g., application executed state), may control functions and/or states related to some (e.g., display device ED60, sensor module ED76, communication module ED90, etc.) of the elements in the electronic apparatus ED01. The auxiliary processor ED23 (e.g., image signal processor, communication processor, etc.) may be implemented as a part of another element (e.g., camera module ED80, communication module ED90, etc.) that is functionally related thereto.

The memory ED30 may store various data required by the elements (e.g., processor ED20, sensor module ED76, etc.) of the electronic apparatus ED01. The data may include, for example, input data and/or output data about software (e.g., program ED40, etc.) and commands related thereto. The memory ED30 may include the volatile memory ED32 and/or the non-volatile memory ED34. The non-volatile memory ED34 may include an internal memory ED36 fixedly installed in the electronic apparatus ED01, and an external memory ED38 that is detachable.

The program ED40 may be stored as software in the memory ED30, and may include an operation system ED42, middleware ED44, and/or an application ED46.

The input device ED50 may receive commands and/or data to be used in the elements (e.g., processor ED20, etc.) of the electronic apparatus ED01, from outside (e.g., a user, etc.) of the electronic apparatus ED01. The input device ED50 may include a microphone, a mouse, a keyboard, and/or a digital pen (e.g., stylus pen).

The sound output device ED55 may output a sound signal to outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a part of the speaker or may be implemented as an independent device.

The display device ED60 may provide visual information to outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (e.g., pressure sensor, etc.) that is set to measure a strength of a force generated by the touch.

The audio module ED70 may convert sound into an electrical signal or vice versa. The audio module ED70 may acquire sound through the input device ED50, or may output sound via the sound output device ED55 and/or a speaker and/or a headphone of another electronic apparatus (e.g., electronic apparatus ED02, etc.) connected directly or wirelessly to the electronic apparatus ED01.

The sensor module ED76 may sense an operating state (e.g., power, temperature, etc.) of the electronic apparatus ED01, or an outer environmental state (e.g., user state, etc.), and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (e.g., electronic apparatus ED02, etc.) The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (e.g., electronic apparatus ED02, etc.). The connection terminal ED78 may include an HDMI connector, a USB connector, an SD card connector, and/or an audio connector (e.g., headphone connector, etc.).

The haptic module ED79 may convert the electrical signal into a mechanical stimulation (e.g., vibration, motion, etc.) or an electric stimulation that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 of FIG. 1, image signal processors, and/or flashes. The lens assembly included in the camera module ED80 may collect light emitted from a subject that is an object to be captured.

The power management module ED88 may manage the power supplied to the electronic apparatus ED01. The power management module ED88 may be implemented as a part of a power management integrated circuit (PMIC).

The battery ED89 may supply electric power to components of the electronic apparatus ED01. The battery ED89 may include a primary battery that is not rechargeable, a secondary battery that is rechargeable, and/or a fuel cell.

The communication module ED90 may support the establishment of a direct (e.g., wired) communication channel and/or a wireless communication channel between the electronic apparatus ED01 and another electronic apparatus (e.g., electronic apparatus ED02, electronic apparatus ED04, server ED08, etc.), and execution of communication through the established communication channel. The communication module ED90 may be operated independently from the processor ED20 (e.g., application processor, etc.), and may include one or more communication processors that support the direct communication and/or the wireless communication. The communication module ED90 may include a wireless communication module ED92 (e.g., cellular communication module, a short-range wireless communication module, a global navigation satellite system (GNSS) communication module) and/or a wired communication module ED94 (e.g., local area network (LAN) communication module, a power line communication module, etc.). From among the communication modules, a corresponding communication module may communicate with another electronic apparatus via a first network ED09 (e.g., short-range communication network such as Bluetooth, WiFi direct, or infrared data association (IrDA)) or a second network ED99 (e.g., long-range communication network such as a cellular network, Internet, or computer network (e.g., LAN, WAN, etc.)). Such above various kinds of communication modules may be integrated as one element (e.g., single chip, etc.) or may be implemented as a plurality of elements (e.g., a plurality of chips) separately from one another. The wireless communication module ED92 may identify and authenticate the electronic apparatus ED01 in a communication network such as the first network ED98 and/or the second network ED99 by using subscriber information (e.g., international mobile subscriber identifier (IMSI), etc.) stored in the subscriber identification module ED96.

The antenna module ED97 may transmit or receive the signal and/or power to/from outside (e.g., another electronic apparatus, etc.). An antenna may include a radiator formed as a conductive pattern formed on a substrate (e.g., printed circuit board (PCB), etc.). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (e.g., radio-frequency integrated circuit (RFIC), etc.) other than the antenna may be included as a part of the antenna module ED97.

Some of the elements may be connected to one another via the communication method among the peripheral devices (e.g., bus, general purpose input and output (GPIO), serial peripheral interface (SPI), mobile industry processor interface (MIPI), etc.) and may exchange signals (e.g., commands, data, etc.).

The command or data may be transmitted or received between the electronic apparatus ED01 and the external electronic apparatus ED04 via the server ED08 connected to the second network ED99. Other electronic apparatuses ED02 and ED04 may be the devices that are the same as or different kinds from the electronic apparatus ED01. All or some of the operations executed in the electronic apparatus ED01 may be executed in one or more devices among the other electronic apparatuses ED02, ED04, and ED08. For example, when the electronic apparatus ED01 needs to perform a certain function or service, the electronic apparatus ED01 may request one or more other electronic apparatuses to perform some or entire function or service, instead of executing the function or service by itself. One or more electronic apparatuses receiving the request execute an additional function or service related to the request and may transmit a result of the execution to the electronic apparatus ED01. To do this, for example, a cloud computing, a distributed computing, or a client-server computing technique may be used.

Figure 10:
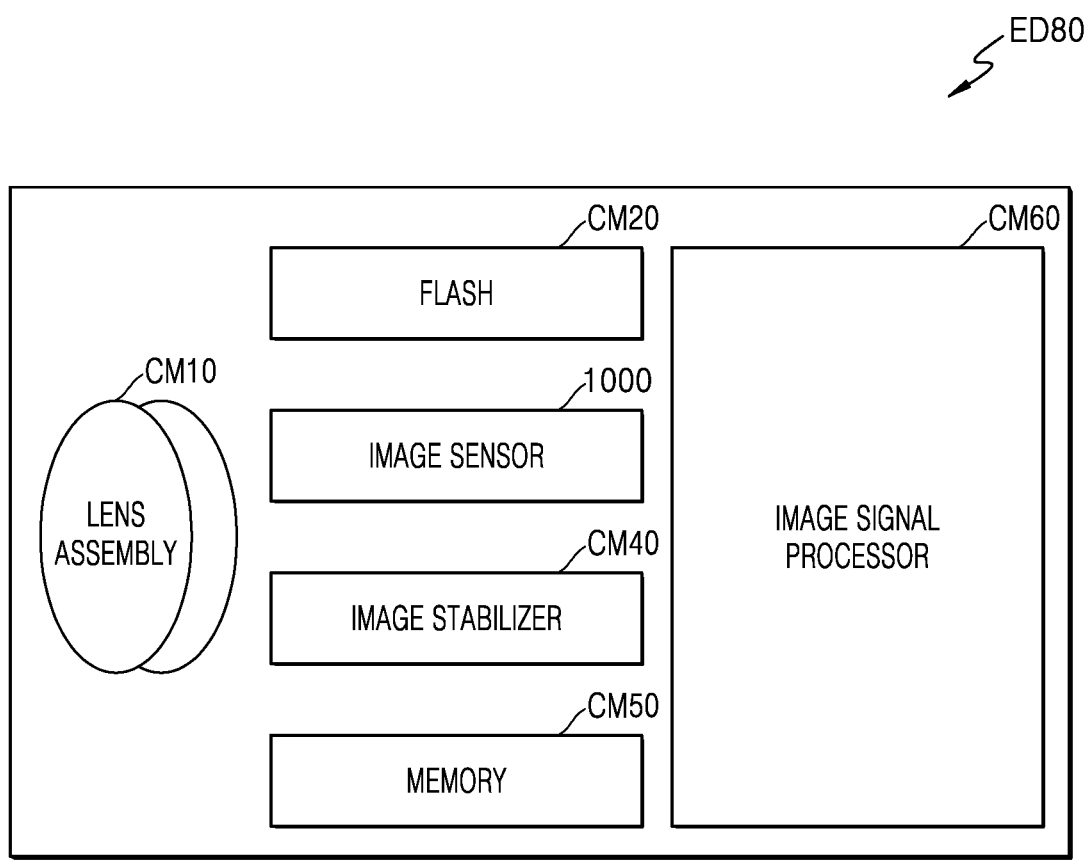
FIG. 10 is a block diagram of a camera module in FIG. 9.

FIG. 10 is a block diagram showing the camera module ED80 of FIG. 9. Referring to FIG. 10, the camera module ED80 may include a lens assembly CM10, a flash CM20, an image sensor 1000 (e.g., the image sensor 1000 of FIG. 1), an image stabilizer CM40, a memory CM50 (e.g., buffer memory, etc.), and/or an image signal processor CM60. The lens assembly CM10 may collect light emitted from a subject, that is, an object to be captured. The camera module ED80 may include a plurality of lens assemblies CM10, and in this case, the camera module ED80 may include, for example, a dual camera module, a 360-degree camera, or a spherical camera. Some of the plurality of lens assemblies CM10 may have the same lens properties (e.g., viewing angle, focal distance, auto-focus, F number, optical zoom, etc.) or different lens properties. The lens assembly CM10 may include a wide-angle lens or a telephoto lens.

The flash CM20 may emit light that is used to strengthen the light emitted or reflected from the object. The flash CM20 may include one or more light-emitting diodes (e.g., red-green-blue (RGB) LED, white LED, infrared LED, ultraviolet LED, etc.), and/or a Xenon lamp. The image sensor 1000 may be the image sensor described above with reference to FIG. 1, and converts the light emitted or reflected from the object and transmitted through the lens assembly CM10 into an electrical signal to obtain an image corresponding to the object. The image sensor 1000 may include one or more selected sensors from among image sensors having different properties such as an RGB sensor, a black-and-white (BW) sensor, an IR sensor, and a UV sensor. Each of the sensors included in the image sensor 1000 may be implemented as a charge-coupled device (CCD) sensor and/or a complementary metal oxide semiconductor (CMOS) sensor.

The image stabilizer CM40, in response to a motion of the camera module ED80 or the electronic apparatus ED01 including the camera module ED80, moves one or more lenses included in the lens assembly CM10 or the image sensor 1000 in a certain direction or controls the operating characteristics of the image sensor 1000 (e.g., adjusting of a read-out timing, etc.) in order to compensate for a negative influence of the motion. The image stabilizer CM40 may sense the movement of the camera module ED80 or the electronic apparatus ED01 by using a gyro sensor (not shown) or an acceleration sensor (not shown) arranged in or out of the camera module ED80. The image stabilizer CM40 may be implemented as an optical type.

The memory CM50 may store some or entire data of the image obtained through the image sensor 1000 for next image processing operation. For example, when a plurality of images are obtained at a high speed, obtained original data (e.g., Bayer-patterned data, high resolution data, etc.) is stored in the memory CM50, and a low resolution image is only displayed. Then, original data of a selected image (e.g., user selection, etc.) may be transmitted to the image signal processor CM60. The memory CM50 may be integrated with the memory ED30 of the electronic apparatus ED01, or may include an additional memory that is operated independently.

The image signal processor CM60 may perform image treatment on the image obtained through the image sensor 1000 or the image data stored in the memory CM50. The image treatments may include, for example, a depth map generation, a three-dimensional modeling, a panorama generation, extraction of features, an image combination, and/or an image compensation (e.g., noise reduction, resolution adjustment, brightness adjustment, blurring, sharpening, softening, etc.). The image signal processor CM60 may perform controlling (e.g., exposure time control, read-out timing control, etc.) of the elements (e.g., image sensor 1000, etc.) included in the camera module ED80. The image processed by the image signal processor CM60 may be stored again in the memory CM50 for additional process, or may be provided to an external element of the camera module ED80 (e.g., the memory ED30, the display device ED60, the electronic apparatus ED02, the electronic apparatus ED04, the server ED08, etc.). The image signal processor CM60 may be integrated with the processor ED20, or may be configured as an additional processor that is independently operated from the processor ED20. When the image signal processor CM60 is configured as an additional processor separately from the processor ED20, the image processed by the image signal processor CM60 undergoes through an additional image treatment by the processor ED20 and then may be displayed on the display device ED60.

The electronic apparatus ED01 may include a plurality of camera modules ED80 having different properties or functions. In this case, one of the plurality of camera modules ED80 may include a wide-angle camera and another camera module ED80 may include a telephoto camera. Similarly, one of the plurality of camera modules ED80 may include a front camera and another camera module ED80 may include a rear camera.

Figure 11:
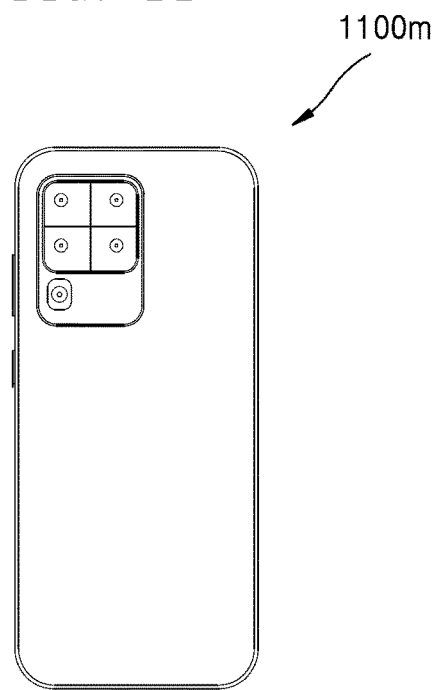
FIGS. 11 to 20 are diagrams showing various examples of an electronic apparatus to which an image sensor according to one or more embodiments is applied.
Figure 12:
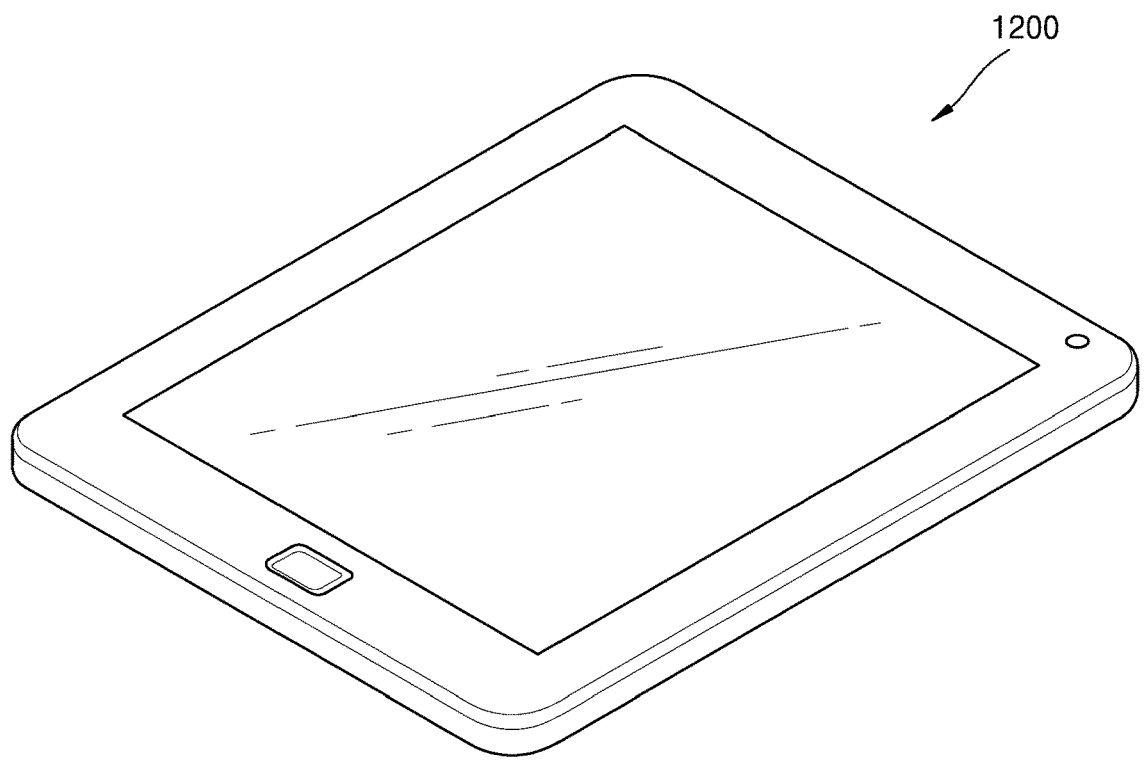
Figure 13:
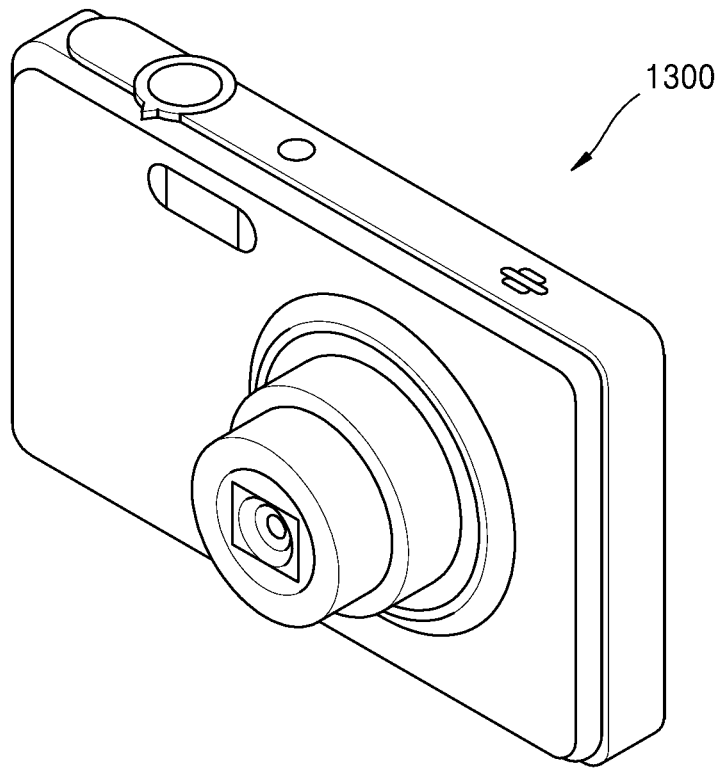
Figure 14:
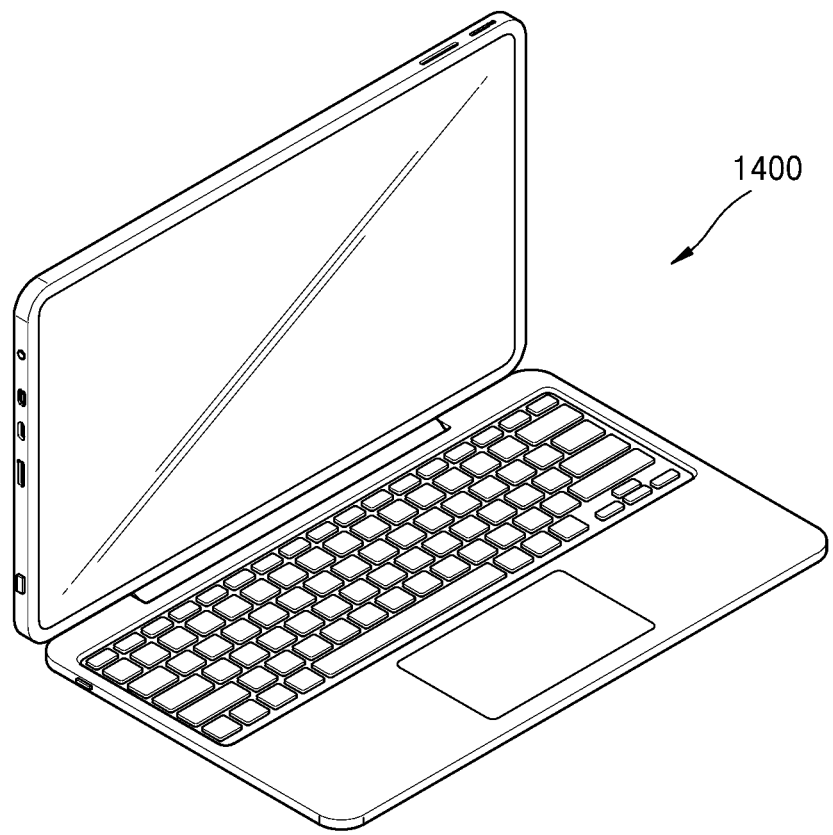
Figure 15:
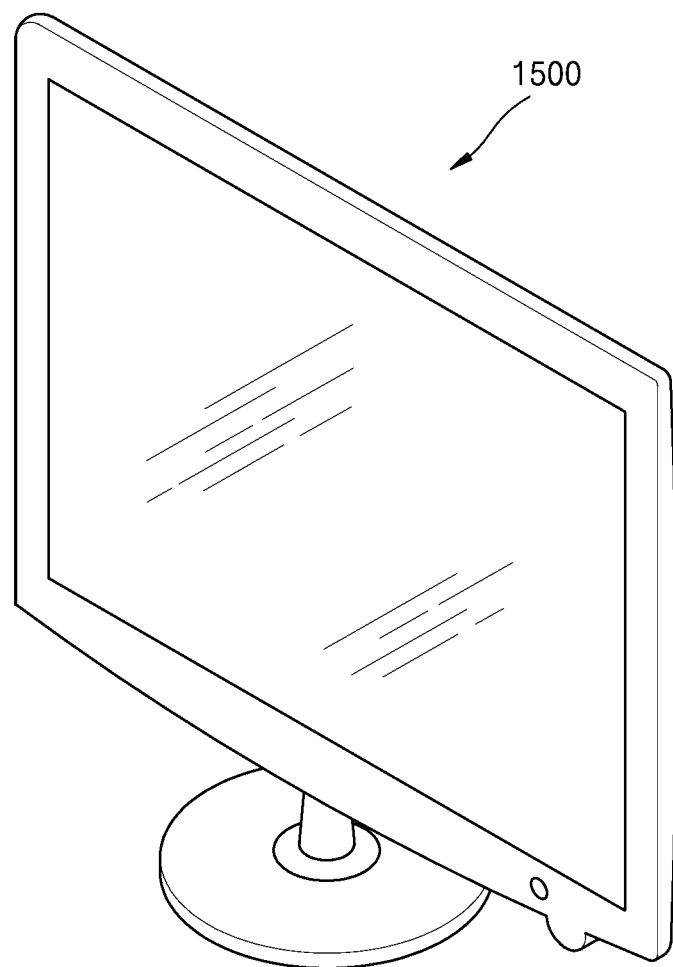

The image sensor 1000 according to the embodiments may be applied to a mobile phone or a smartphone 1100m shown in FIG. 11, a tablet or a smart tablet 1200 shown in FIG. 12, a digital camera or a camcorder 1300 shown in FIG. 13, a laptop computer 2400 shown in FIG. 14, or a television or a smart television 1500 shown in FIG. 15. For example, the smartphone 1100m or the smart tablet 1200 may include a plurality of high-resolution cameras each including a high-resolution image sensor. Depth information of objects in an image may be extracted, out focusing of the image may be adjusted, or objects in the image may be automatically identified by using the high-resolution cameras.

Figure 16:
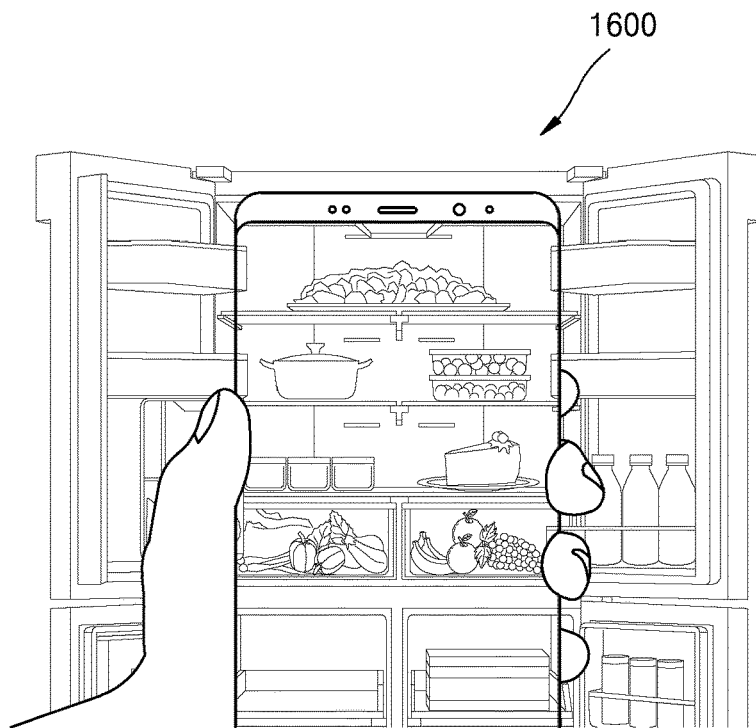
Figure 17:
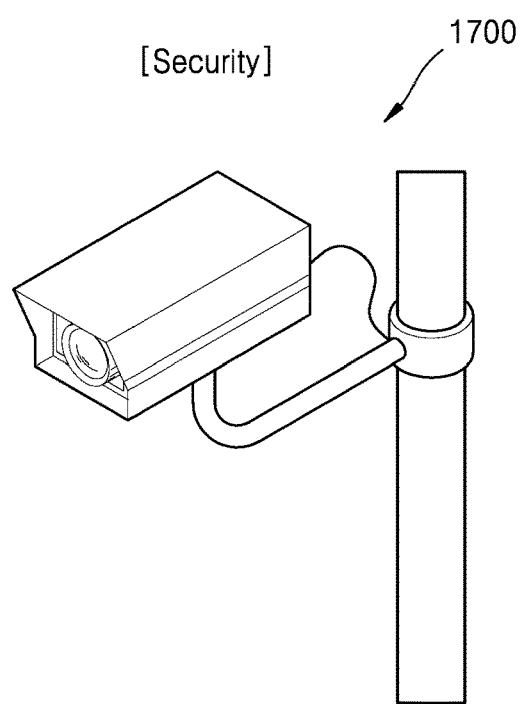
Figure 18:
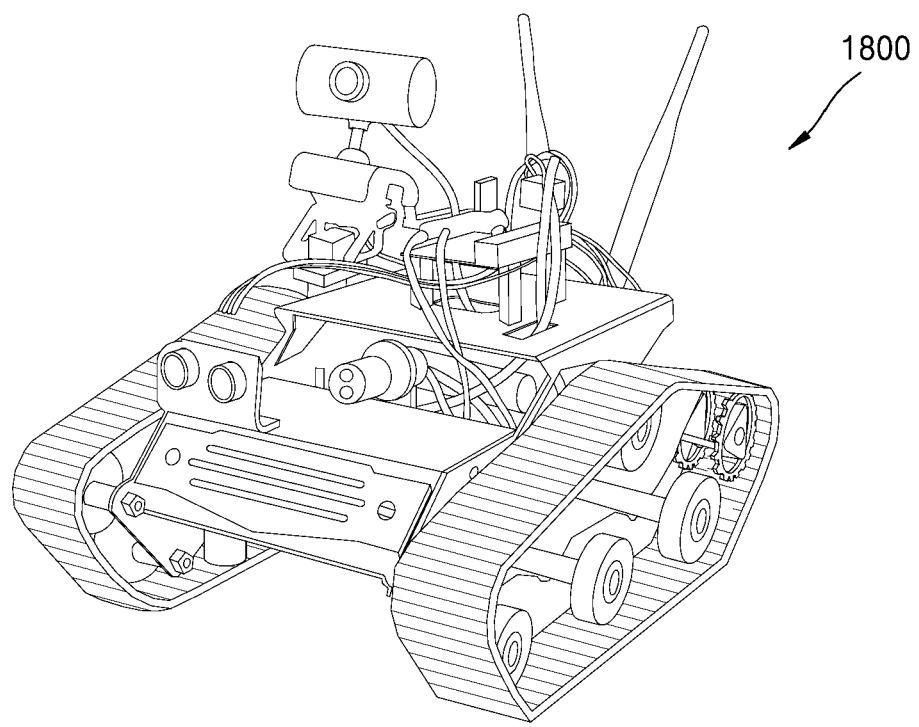
Figure 19:
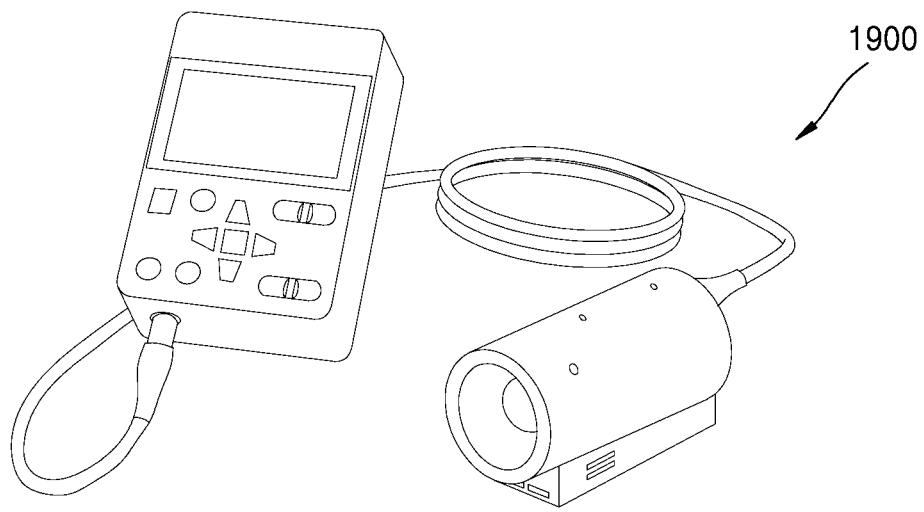

Also, the image sensor 1000 may be applied to a smart refrigerator 1600 shown in FIG. 16, a surveillance camera 1700 shown in FIG. 17, a robot 1800 shown in FIG. 18, a medical camera 1900 shown in FIG. 19, etc. For example, the smart refrigerator 1600 may automatically recognize food in the refrigerator by using the image sensor, and may notify the user of an existence of a certain kind of food, kinds of food put into or taken out, etc. through a smartphone. Also, the surveillance camera 1700 may provide an ultra-high-resolution image and may allow the user to recognize an object or a person in the image even in dark environment by using high sensitivity. The robot 1900 may be used at a disaster or industrial site that a person may not directly access, to provide the user with high-resolution images. The medical camera 1900 may provide high-resolution images for diagnosis or surgery, and may dynamically adjust a field of view.

Figure 20:
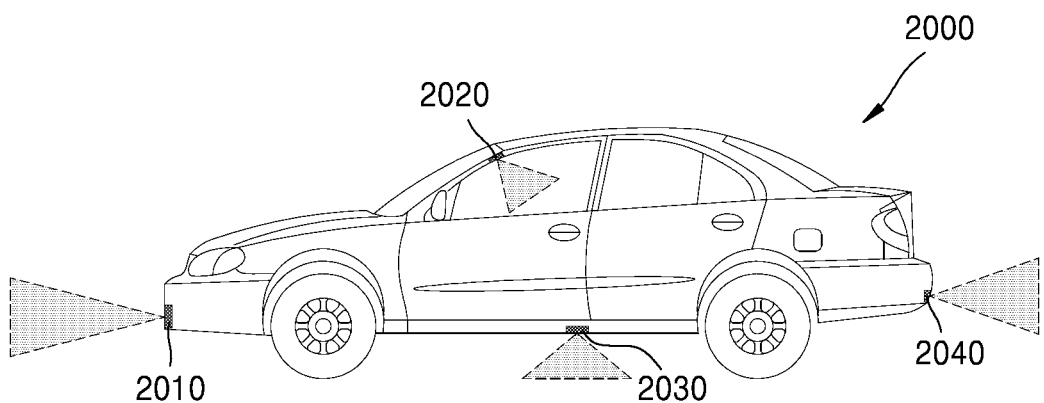

Also, the image sensor 1000 may be applied to a vehicle 2000 as shown in FIG. 20. The vehicle 2000 may include a plurality of vehicle cameras 2010, 2020, 2030, and 2040 at various locations. Each of the vehicle cameras 2010, 2020, 2030, and 2040 may include the image sensor according to the one or more embodiments. The vehicle 2000 may provide a driver with various information about the interior of the vehicle 2000 or the periphery of the vehicle 2000 by using the plurality of vehicle cameras 2010, 2020, 2030, and 2040, and may provide the driver with the information used for the autonomous travel by automatically recognizing an object or a person in the image.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
a sensor substrate including a first pixel configured to sense first wavelength light, and a second pixel configured to sense second wavelength light; and
a color separating lens array provided on the sensor substrate and including a first wavelength light condensing region in which the first wavelength light, from incident light, is condensed onto the first pixel,
wherein an area of the first wavelength light condensing region is greater than an area of the first pixel, and
wherein a distance between the sensor substrate and the color separating lens array is less than a focal distance of the first wavelength light condensing region with respect to the first wavelength light.

2. The image sensor of claim 1,
wherein the distance between the sensor substrate and the color separating lens array is about 30% to about 70% of the focal distance of the first wavelength light condensing region with respect to the first wavelength light.

3. The image sensor of claim 1,
wherein the distance between the sensor substrate and the color separating lens array is about 40% to about 60% of the focal distance of the first wavelength light condensing region with respect to the first wavelength light.

4. The image sensor of claim 1, further comprising a spacer layer provided between the sensor substrate and the color separating lens array.

5. The image sensor of claim 4,
wherein the focal distance of the first wavelength light condensing region is represented by the following equation:

$$\frac{np^2}{\lambda_0} - \frac{\lambda_0}{4n},$$

where p denotes a pixel pitch of the sensor substrate, n denotes a refractive index of the spacer layer, and $\lambda_0$ denotes a reference wavelength of a wavelength band of light separated by the color separating lens array.

6. The image sensor of claim 1,
wherein the first pixel includes a plurality of photosensitive cells configured to independently sense the first wavelength light.

7. The image sensor of claim 1,
wherein the first wavelength light that has passed through the first wavelength light condensing region has a phase profile which decreases away from a center of the first wavelength light condensing region.

8. The image sensor of claim 1,
wherein the area of the first wavelength light condensing region is about 1.2 times to about 4 times greater than the area of the first pixel.

9. The image sensor of claim 1, wherein
the sensor substrate further comprises a third pixel configured to sense third wavelength light,
the color separating lens array includes a second wavelength light condensing region in which the second wavelength light, from the incident light, is condensed onto the second pixel and a third wavelength light condensing region in which the third wavelength light, from the incident light, is condensed onto the third pixel, and
an area of the second wavelength light condensing region is greater than an area of the second pixel, and an area of the third wavelength light condensing region is greater than an area of the third pixel.

10. The image sensor of claim 9,
wherein the first wavelength light condensing region partially overlaps the second wavelength light condensing region and the third wavelength light condensing region.

11. The image sensor of claim 1,
wherein the color separating lens array includes:
a first pixel corresponding region at a position corresponding to the first pixel; and
a second pixel corresponding region at a position corresponding to the second pixel, and
wherein a difference between phases of the first wavelength light that has passed through a center of the first pixel corresponding region and the first wavelength light that has passed through the second pixel corresponding region is about $0.9\pi$ to about $1.1\pi$.

12. An image sensor comprising:
a sensor substrate including a first pixel configured to sense first wavelength light, and a second pixel configured to sense second wavelength light; and
a color separating lens array provided on the sensor substrate and including a first wavelength light condensing region in which the first wavelength light, from incident light, is condensed onto the first pixel, the first wavelength light condensing region having an area greater than an area of the first pixel,
wherein a pixel pitch of the sensor substrate is about 0.9 μm to about 1.3 μm, and
wherein a distance between the sensor substrate and the color separating lens array is about 110% to about 180% of the pixel pitch of the sensor substrate.

13. The image sensor of claim 12,
wherein the first wavelength light that has passed through the first wavelength light condensing region has a phase profile which decreases away from a center of the first wavelength light condensing region.

14. The image sensor of claim 12, further comprising a spacer layer provided between the sensor substrate and the color separating lens array.

15. The image sensor of claim 12,
wherein the first pixel includes a plurality of photosensitive cells configured to independently sense the first wavelength light.

16. The image sensor of claim 12, wherein
the sensor substrate further comprises a third pixel configured to sense third wavelength light,
the color separating lens array includes a second wavelength light condensing region in which the second wavelength light, from the incident light, is condensed onto the second pixel and a third wavelength light condensing region in which the third wavelength light, from the incident light, is condensed onto the third pixel, and
an area of the second wavelength light condensing region is greater than an area of the second pixel, and an area of the third wavelength light condensing region is greater than an area of the third pixel.

17. The image sensor of claim 16,
wherein the first wavelength light condensing region partially overlaps the second wavelength light condensing region and the third wavelength light condensing region.

18. An image sensor comprising:
a sensor substrate including a first pixel configured to sense first wavelength light, and a second pixel configured to sense second wavelength light; and
a color separating lens array provided on the sensor substrate and including a first wavelength light condensing region in which the first wavelength light, from incident light, is condensed onto the first pixel, the first wavelength light condensing region having an area greater than an area of the first pixel,
wherein a pixel pitch of the sensor substrate is about 0.5 μm to about 0.9 μm, and
wherein a distance between the sensor substrate and the color separating lens array is about 70% to about 120% of the pixel pitch of the sensor substrate.

19. The image sensor of claim 18,
wherein the first wavelength light that has passed through the first wavelength light condensing region has a phase profile which decreases away from a center of the first wavelength light condensing region.

20. The image sensor of claim 18, further comprising a spacer layer provided between the sensor substrate and the color separating lens array.

21. The image sensor of claim 18,
wherein the first pixel includes a plurality of photosensitive cells configured to independently sense the first wavelength light.

22. The image sensor of claim 18, wherein
the sensor substrate further comprises a third pixel configured to sense third wavelength light,
the color separating lens array includes a second wavelength light condensing region in which the second wavelength light, from the incident light, is condensed onto the second pixel and a third wavelength light condensing region in which the third wavelength light, from the incident light, is condensed onto the third pixel, and
an area of the second wavelength light condensing region is greater than an area of the second pixel, and an area of the third wavelength light condensing region is greater than an area of the third pixel.

23. The image sensor of claim 22,
wherein the first wavelength light condensing region partially overlaps the second wavelength light condensing region and the third wavelength light condensing region.

24. An electronic apparatus comprising:
an image sensor configured to convert an optical image into an electrical signal; and
a processor configured to control operations of the image sensor and configured to store and output a signal generated by the image sensor,
wherein the image sensor comprises:
a sensor substrate including a first pixel configured to sense first wavelength light, and
a second pixel configured to sense second wavelength light; and
a color separating lens array provided on the sensor substrate and including a first wavelength light condensing region in which the first wavelength light, from incident light, is condensed onto the first pixel,
wherein an area of the first wavelength light condensing region is greater than an area of the first pixel, and
wherein a distance between the sensor substrate and the color separating lens array is less than a focal distance of the first wavelength light condensing region with respect to the first wavelength light.

25. The electronic apparatus of claim 24,
wherein the distance between the sensor substrate and the color separating lens array is about 30% to about 70% of the focal distance of the first wavelength light condensing region with respect to the first wavelength light.

26. The electronic apparatus of claim 24,
wherein the distance between the sensor substrate and the color separating lens array is about 40% to about 60% of the focal distance of the first wavelength light condensing region with respect to the first wavelength light.

27. The electronic apparatus of claim 24, further comprising a spacer layer provided between the sensor substrate and the color separating lens array.

28. The electronic apparatus of claim 27,
wherein the focal distance of the first wavelength light condensing region is represented by the following equation:

$$\frac{np^2}{\lambda_0} - \frac{\lambda_0}{4n},$$

where p denotes a pixel pitch of the sensor substrate, n denotes a refractive index of the spacer layer, and $\lambda_0$ denotes a reference wavelength of a wavelength band of light separated by the color separating lens array.

29. The electronic apparatus of claim 24,
wherein the first pixel includes a plurality of photosensitive cells configured to independently sense the first wavelength light.

30. The electronic apparatus of claim 24,
wherein the first wavelength light that has passed through the first wavelength light condensing region has a phase profile which decreases away from a center of the first wavelength light condensing region.

31. The electronic apparatus of claim 24,
wherein the area of the first wavelength light condensing region is about 1.2 times to about 4 times greater than the area of the first pixel.

32. The electronic apparatus of claim 24, wherein
the sensor substrate further comprises a third pixel configured to sense third wavelength light,
the color separating lens array includes a second wavelength light condensing region in which the second wavelength light, from the incident light, is condensed onto the second pixel and a third wavelength light condensing region in which the third wavelength light, from the incident light, is condensed onto the third pixel, and
an area of the second wavelength light condensing region is greater than an area of the second pixel, and an area of the third wavelength light condensing region is greater than an area of the third pixel.

33. The electronic apparatus of claim 32,
wherein the first wavelength light condensing region partially overlaps the second wavelength light condensing region and the third wavelength light condensing region.

34. The electronic apparatus of claim 24,
wherein the color separating lens array includes:
a first pixel corresponding region at a position corresponding to the first pixel; and
a second pixel corresponding region at a position corresponding to the second pixel, and
wherein a difference between phases of the first wavelength light that has passed through a center of the first pixel corresponding region and the first wavelength light that has passed through the second pixel corresponding region is about $0.9\pi$ to about $1.1\pi$.

35. The electronic apparatus of claim 24, wherein
a pixel pitch of the sensor substrate is about 0.9 μm to about 1.3 μm, and
the distance between the sensor substrate and the color separating lens array is about 110% to about 180% of the pixel pitch of the sensor substrate.

36. The electronic apparatus of claim 24, wherein
a pixel pitch of the sensor substrate is about 0.5 μm to about 0.9 μm, and
the distance between the sensor substrate and the color separating lens array is about 70% to about 120% of the pixel pitch of the sensor substrate.

* * * * *